United States Patent [19]
Fredrickson

[11] Patent Number: 5,801,649
[45] Date of Patent: Sep. 1, 1998

[54] MATCHED SPECTRAL NULL ENCODER/DECODER

[75] Inventor: Lisa Fredrickson, Ojai, Calif.

[73] Assignee: Seagate Technology, Inc., Scotts Valley, Calif.

[21] Appl. No.: 817,865

[22] PCT Filed: Aug. 2, 1996

[86] PCT No.: PCT/US96/12680

§ 371 Date: Apr. 21, 1997

§ 102(e) Date: Apr. 21, 1997

[87] PCT Pub. No.: WO97/06624

PCT Pub. Date: Feb. 20, 1997

Related U.S. Application Data

[60] Provisional application No. 60/001,986, Aug. 3, 1998.

[51] Int. Cl.$^6$ .................................................. H03M 13/00
[52] U.S. Cl. ........................................... 341/58; 371/43.4
[58] Field of Search ................................ 341/58; 371/43.4

[56] References Cited

U.S. PATENT DOCUMENTS

| | | | |
|---|---|---|---|
| 5,073,776 | 12/1991 | Shigemori | 341/406 |
| 5,497,384 | 3/1996 | Frederickson et al. | 341/43 |
| 5,537,424 | 7/1996 | Karabed et al. | 371/43 |
| 5,608,397 | 3/1997 | Soljanin | 341/58 |
| 5,731,768 | 3/1998 | Tsang | 341/59 |

FOREIGN PATENT DOCUMENTS

| | | |
|---|---|---|
| 0 097 763 A2 | 1/1984 | European Pat. Off. . |
| 0 150 083 A2 | 7/1985 | European Pat. Off. . |
| 0 333 324 A | 9/1989 | European Pat. Off. . |
| 0 503 863 A2 | 9/1992 | European Pat. Off. . |

OTHER PUBLICATIONS

K. J. Knudson et al., *A Concatenated Decoding Scheme for (1–D) Partial Response with Matched Spectral–Null Coding*, Proceedings of 1993 IEEE Global Telecomm. Conf. (GLOBECOM '93), pp. 1960–1964 (Nov. 1993).

Gu, Jian et al., A New Approach to Constructing Optimal Block Codes for Runlength–Limited Channels, 8097 IEEE ransactions on Information Theory, 40(1994) May, No. 3., pp. 774–785.

*Primary Examiner*—Howard L. Williams
*Attorney, Agent, or Firm*—Kinney & Lange, P.A.

[57] ABSTRACT

An encoder for matched spectral null binary codes is described, particularly for 12B/15B codes. The codeword trellis is partitioned into two or more subtrellises, and each subtrellis is encoded separately. The codeword is the concatenation of the codewords produced by the subtrellises. Some valid sequences have to be excluded, in order to ensure that all concatenations are valid, but the storage requirements, are greatly reduced.

10 Claims, 18 Drawing Sheets

MATCHED SPECTRAL NULL ENCODER/DECODER

This application claims the priority benefit of U.S. provisional application Ser. No. 60/001,986, filed Aug. 3, 1995.

BACKGROUND OF THE INVENTION

This invention relates to encoding digital data for transmission through partial response channels. More particularly, the present invention relates to implementing a 12/15 matched spectral null encoder.

Information that is passed from a source to a destination can, in general, be described as passing through a channel. Ideally, the channel should transmit the information without modifying it, but in reality, all channels modify information or signals that pass through them. The modifications vary from channel to channel, but in general can be categorized into one or more types. One type of modification, known as a partial response, creates a channel output signal that is a combination of the original input signal and the original input signal delayed by one or more time units. Such partial responses are often described in terms of a transfer polynomial, $h(D)=(1 \pm D^N)$, where $h(D)$ represents the channel's output, "1" represents the original signal and $D^N$ represents the original signal delayed by N times units. For instance, many computer disc drives have channels that exhibit a class-IV partial response, also known as a PR(4) response, which has a transfer function $h(D)$ of $(1-D^2)$ that produces an output signal that is equal to the input signal minus the input signal delayed by two time units.

Partial response transfer functions, like the one above have associated spectral nulls which are frequencies that the transfer function does not transmit. For instance, a channel acting as a PR(4) channel at a data rate X, will not transmit the constituent frequency X/2, known as the Nyquist frequency, nor the frequency zero, known as D.C.

The spectral nulls of a channel are of interest because it has been shown that the reliability of data recovery at the destination can be improved if the channel's input signal is encoded so that the spectral power density of the encoded signal drops to zero at the spectral nulls of the channel. Such coded signals are known as matched spectral null codes, and their properties have been described in detail in such works as R. Karabed and P. H. Siegel's, "Matched Spectral-Null Codes for Partial-Response Channels," IEEE Trans. Info. Th., vol. 37, No. 3, pp. 81–855, May 1991.

Of particular interest are matched spectral null codes with spectral power densities that match the spectral nulls of a dicode channel (1-D). These codes may be used to create two separate encoded signals which may be interleaved to create an encoded signal with spectral power densities that match the spectral nulls of a PR(4) $(1-D^2)$ channel.

In a 12/15 matched spectral null code, an input signal is encoded by converting twelve bit segments of the input signal into fifteen bit codewords. Since there are $2^{12}(4096)$ possible input values, which each require a valid and unique codeword, implementing an encoder to translate 12-bit input values into 15-bit codewords could be accomplished by using a single table of 4096 entries, with each entry containing a 15-bit codeword addressable by a 12-bit value. However, to implement a table of that size would require a large number of components, and in nearly every application of such an encoder, it is desirable to have as few components as possible.

EP-A-0097763 discloses the division of an input value to two encoders which provide preset values which are subsequently concatenated to provide an output value. A disparity control chooses the complement of the output value depending upon the disparity value in order to reduce run lengths.

EP-A-0503863 relates to lexicographically encoding and decoding codes, and discloses a set of coding rules to permit a trellis code to be efficiently employed in a NRZ format.

SUMMARY OF THE INVENTION

In a first aspect the present invention provides a method of encoding an input value as an encoded value, the method comprising:

accessing at least two preset values by applying at least two values derived from the input value to at least two accessing means, respectively, each accessed preset value from a respective set of preset values, each set of preset values representing portions of a trellis code, the trellis code defined by allowed states for a running-digital sum, which increases by one with each binary one in the encoded value and which decreases by one with each binary zero in the encoded value, the number of possible encoded values that the trellis code can create being more than the number of possible input values, at least one possible preset value excluded from a set of preset values because its concatenation with at least one preset value form at least one other respective set of preset values creates an encoded value that violates a coding constraint and concatenating the accessed preset values to form the encoded value, the method characterised by:

choosing the sets of preset values, from which the preset values are accessed, based on the entire input value.

In a second aspect the present invention provides a method of encoding an input value as an encoded value, the method comprising:

comparing the input value to a first set of threshold values;

determining a state, a remainder and at least two binary digits of the encoded value based on the comparisons;

using the remainder and the state to generate at least two other binary digits of the encoded value.

The present invention is a method of encoding an input value by accessing at least two preset values. The two preset values are accessed by applying two values derived from the input value to at least two accessing means, respectively. At least one of the preset values contains more than one binary digit of the encoded value. The encoded value if formed by concatenating the accessed preset values.

In one embodiment of the present invention, codewords are bisected and the two resulting sections of each codeword are assigned to one of a set of tables where they are stored as preset values. The tables are such that all of the preset values within one table may be concatenated with all of the preset values of at least one other table to produce a full codeword. Thus, for 15-bit codewords, if one table has 8-bit preset values representing the most significant bits of the codewords, at least one other table has a set of 7-bit entries representing the least significant bits of the codewords.

By bisecting the codewords, the number of table entries required to translate an input value to an encoded value is greatly reduced. For example, if a first table has six entries representing the first X bits of the codeword and a second table has four entries representing the last Y bits of the codeword, the six entries of the first table can be concatenated with the four entries of the second table in 24 different ways ((6)*(4)) to produce 24 different codewords. Thus, ten entries across two tables (6+4) are able to define as many codewords as a 24 entry table. By or reducing the number of entries required to create the codewords, the present invention reduces the number of components required to encode values.

In a second embodiment of the present invention, a 12/15 matched spectral null encoder is implemented by recursively selecting two- bit sections of the codeword. The initial selection is based on the input value which is modified after the selection. The modified value is used in the next selection, after which, it is again modified. The selections and modifications recursively repeat for five selections producing ten bits of the codeword. The modified input value is then used to address one of three tables containing the five least significant bits of the codewords. The selected 5-bit value is concatenated with the 10-bits previously selected, forming the 15-bit codeword. The recursive nature of the method and the limited number of entries in the three tables reduces the number of components required to translate the 12-bit input value to a 15-bit codeword.

BRIEF DESCRIPTION OF THE DRAWINGS

FIG. 6I is a flow chart of the fifth recursive partition of the second embodiment of the present invention for a trellis state "M".

DETAILED DESCRIPTION OF THE PREFERRED EMBODIMENTS

Figure 1:
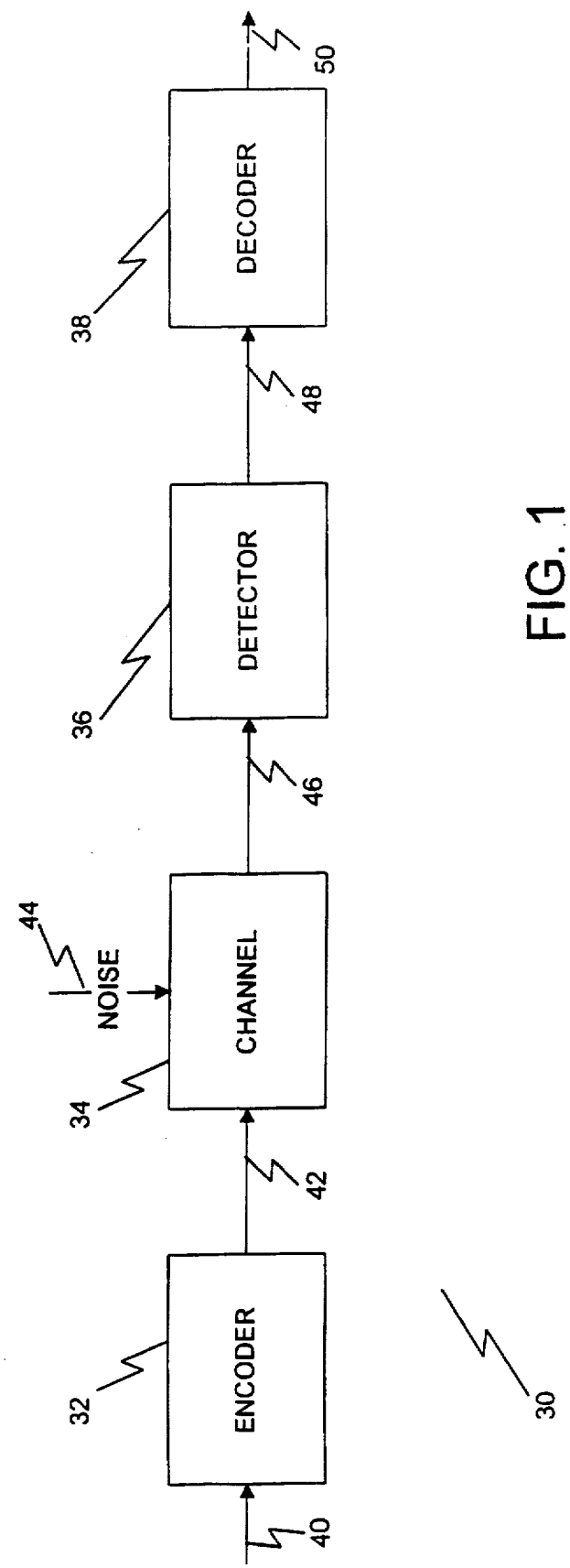
FIG. 1 is a block diagram of a typical communication system.

FIG. 1 is a block diagram of communication system 30, which includes encoder 32, channel 34, detector 36 and decoder 38. Encoder 32 receives INPUT VALUES 40 and, using an encoding map, creates a series of codewords. The series of codewords are concatenated to form CODEWORDS signal 42, which is output from encoder 32. CODEWORDS signal 42 preferably has a spectral power density that matches the spectral nulls of channel 34, which has a partial response transfer function.

CODEWORDS signal 42 is transmitted through channel 34, where it is changed by NOISE 44 and the partial response of channel 34 to produce READ signal 46, which is output from channel 34 to detector 36. READ signal 46 is sampled by detector 36, which determines the most likely codewords represented by READ signal 46. Detector 36 is preferably a Viterbi Detector, a type of detector that is well known in the art. Detector 36 creates LIKELY CODEWORDS 48, which is input to decoder 38. Decoder 38 includes a decoding map that is the inverse of the encoding map used by encoder 32. Using the decoding map, decoder 38 translates the values in LIKELY CODEWORDS 48 to OUTPUT VALUES 50 which are a representation of INPUT VALUES 40.

Figure 2:
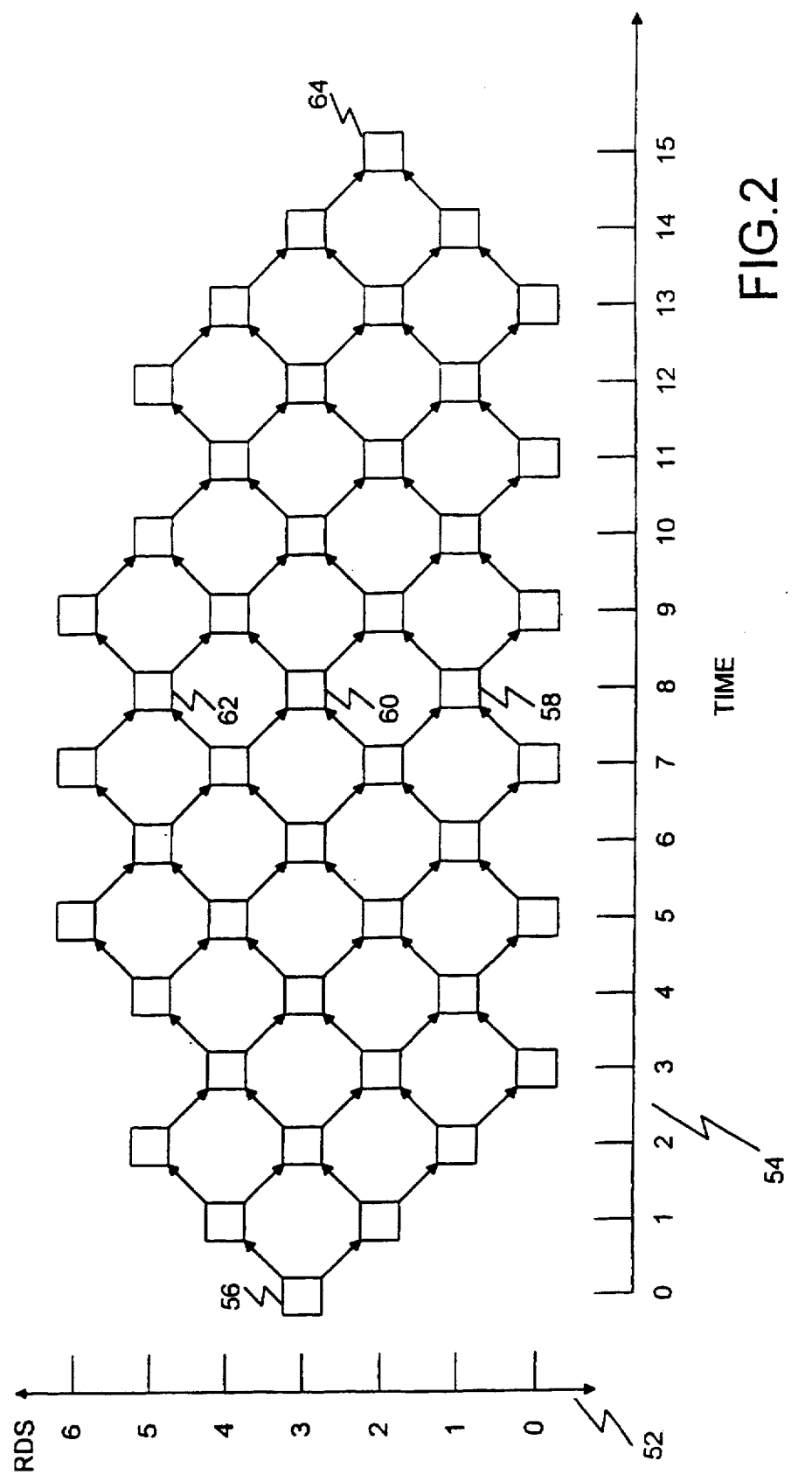
FIG. 2 is a trellis diagram for a 12/15 encoder/decoder.

FIG. 2 is a trellis diagram for a 12/15 encoder/decoder such as encoder 32 and decoder 38 of FIG. 1. The trellis diagram of FIG. 2 has a vertical axis 52 representing a running digital sum with integer values from zero to six, and a horizontal axis 54 representing sixteen discrete time periods with the transition between each time period representing the selection of a bit in a codeword. The codeword bits are selected in order from most significant bit to least significant bit, beginning with the transition from time 0 to time 1 and ending with the transition from time 14 to time 15. The selection of a "1" as a codeword bit is represented in the trellis diagram by an upwardly diagonal that is associated with adding 1 to the running digital sum. A "0" in the codeword is represented by a downwardly diagonal arrow that is associated with subtracting 1 from the running digital sum.

The trellis diagram of FIG. 2 limits the possible codewords that may be constructed by limiting the allowable values of the running digital sum. For instance, a running digital sum of six is not allowed at time period three, which forces a codeword bit selection of "0" when the running digital sum is five at time two. Similarly, the trellis diagram never allows the running digital sum to be less than zero or greater than six. These limitations introduce zeros into the spectral power density of the codewords which match the spectral nulls of a (1-D) partial response channel.

Each pathway through the trellis from time zero to time 15 represents a possible codeword. The trellis diagram of FIG. 2 is capable of producing 4,202 possible codewords. However, not all of these codewords are used because the present invention includes an additional constraint that does not allow six consecutive same symbols in a codeword. For instance, a codeword may not contain six consecutive 1's or six consecutive 0's. Twenty-five of the possible codeword that can be produced by the trellis diagram of FIG. 2 violate this additional constraint. This leaves 4,177 valid codewords. Since there are 4,096 possible twelve-bit input values, the trellis diagram of FIG. 2 provides more than enough codewords to encode all of the possible twelve-bit values.

The trellis diagram of FIG. 2 can be dissected into two parts one from time period 0 to time period 8 and one from time period 8 to time period 15. This division produces six different groups of paths, three of which start at state 56, which has a running digital sum of 3 at time zero. These paths end at states 58, 60, 62 which are all located at time eight and have running digital sums of 1, 3, and 5 respectively. Three other groups of path end at state 64, which has a running digital sum of 2 at time fifteen. These three groups of paths begin at states 58, 60, and 62 respectively. In one embodiment of the invention, these groups of paths are used to define table entries to construct codewords.

The group of paths from state 56 to state 62 includes forty-three separate paths, and the group of paths from state 62 to state 64 includes eighteen separate paths. The total number of paths passing through state 62 is equal to forty-three multiplied by eighteen giving a total of 774 paths representing complete codewords. However, of these 774 codewords, sixteen violate the restriction against six consecutive same symbols.

In order to eliminate these invalid codewords, the first embodiment of the present invention initially removes one path from state 56 to state 62 and one path from state 62 to state 64, leaving forty-two and seventeen paths respectively. The path from state 56 to state 62 that is removed represents the eight-bit pattern "00011111", which would be the first eight bits of a codeword. By initially eliminating these eight bits as a beginning sequence for codewords, the present invention removes four invalid codewords and fourteen valid codewords from the list of codewords. The path from state 62 to state 64 that is removed represents the 7-bit value "0000011", which represents the seven least significant bits of some codewords. By eliminating this path, the present invention eliminates thirty valid codewords and twelve codewords which would violate the six consecutive same symbol constraint.

As discussed further below, the present invention removes an additional path from state 62 to state 64 so that there will be exactly sixteen paths from state 62 to state 64. This additional state is removed because sixteen entries in a table are evenly addressable by a 4-bit digital value, making it easier to implement addressing directly from the input value. The combination of forty-two paths from state 56 to state 62 and sixteen paths from state 62 to state 64 provides a total of 672 paths that pass through state 62. In the first embodiment of the present invention, input values from "0" to "671" decimal, are each assigned to one of the codewords represented by these 672 paths.

State 58 has a total of 1,316 paths which pass through it. These paths are constructed from forty-seven paths from state 56 to state 58 and twenty-eight paths from state 58 to state 64. Unlike the codewords which pass through state 62, all 1,316 paths through state 58 represent valid codewords. In the first embodiment of the present invention, input values of 672 to 1987 decimal are assigned to the 1,316 codewords represented by paths which pass through state 58.

There are a total of 2,112 paths which pass through state 60 and which are constructed from a combination of one of the sixty-four paths from state 56 to state 60 and one of thirty-three paths from state 60 to state 64. However, nine of the these paths violate the six consecutive same symbol constraints, leaving 2,103 valid paths.

In the first embodiment of the present invention, all of the input values between 1988 and 4095 decimal, with the exception of nine such values, are individually assigned to one of the 2,112 paths passing through state 60. This represents a total of 2,099 assignments, leaving thirteen unassigned paths and nine unassigned input values. Nine of the unassigned paths represent invalid codewords leaving four unassigned paths that represent valid codewords. To complete the assignment of the nine unassigned input values, the present invention, as discussed further below, carefully selects codewords which include the earlier eliminated path from state 56 to state 62 (namely "00011111"), and uses three of the four unassigned valid codewords that pass through state 60.

Figure 3:
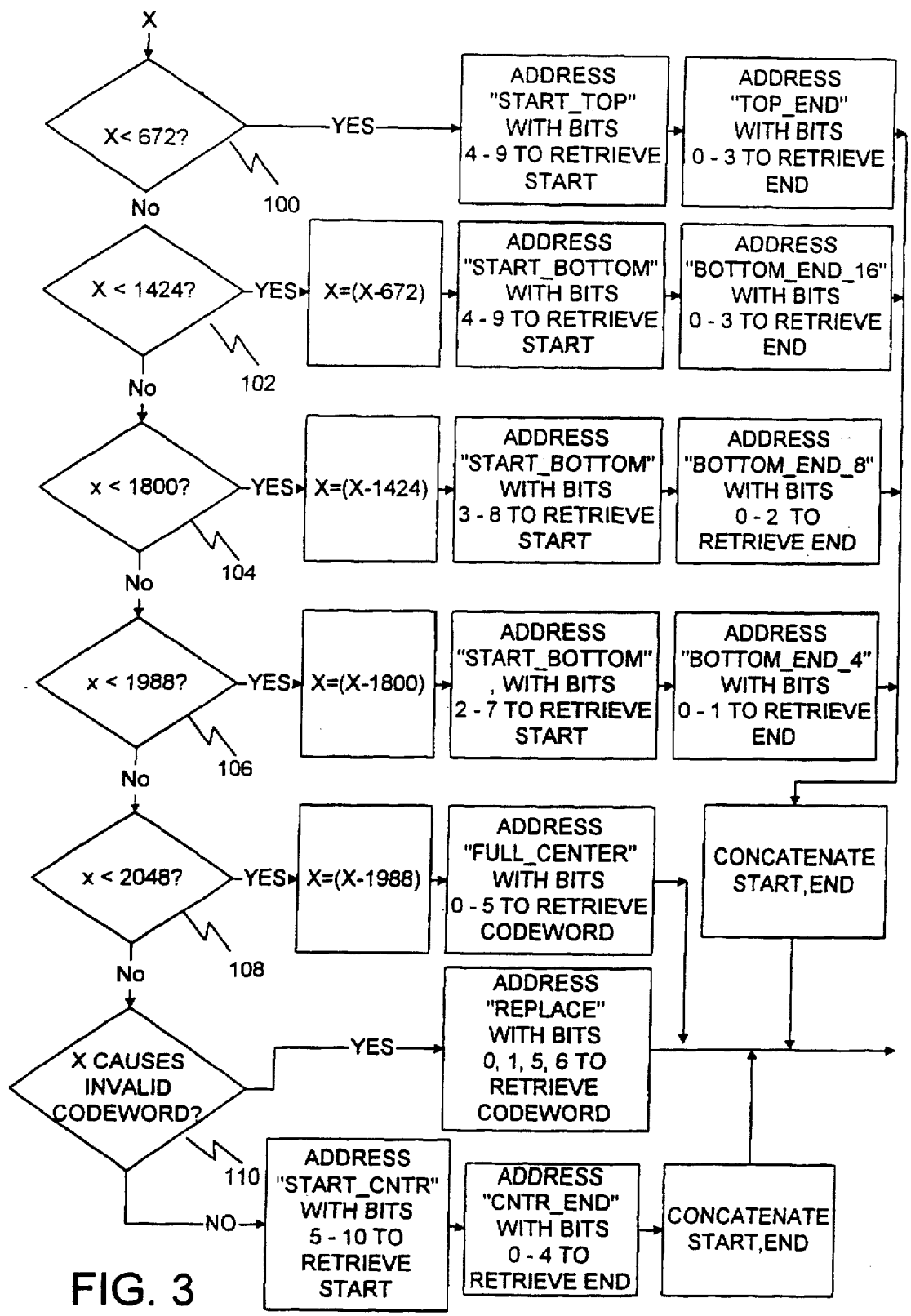
FIG. 3 is a flow chart of an encoding method for a first embodiment of the present invention.

FIG. 3 is a flow chart of a first embodiment of the present invention. In the flow chart, an input value "X" is compared against several threshold values to determine which of a plurality of tables should be accessed to retrieve portions of a codeword for concatenation, or to access an entire codeword.

In decision box 100, the input value is compared against the decimal value 672. If the input value is less than 672, tables "START_TOP" and "TOP_END" are addressed to retrieve two sections of the codeword denoted as "START" and "END" respectively. The entries in table "START_TOP" and "TOP_END" represent portions of codewords which pass through state 62 of the trellis diagram of FIG. 2.

Table "START_TOP" and "TOP_END" are found in Appendix A. Within table "START_TOP", the portions of the codewords represented by paths from state 56 to state 62 are listed underneath the headings "START". Next to each codeword portion is an address used to retrieve that portion from the table. For instance, addressing "START_TOP" with a binary value of 000111 would retrieve a start value of "01011011". Similarly, table "TOP_END" shows the sixteen codeword portions represented as paths from state 62 to state 64 in the trellis diagram of FIG. 2. These portions are shown under the heading "END" and next to an address which may be used to retrieve the codeword portion from the table.

For a value less than 672 decimal, the entire value may be defined by the least significant 10-bits of a 12-bit input word, denoted as bits 0 through 9 from least significant to most significant, respectively. The advantage of having reduced the number of valid paths from state 62 to state 64 in FIG. 2 is realized in addressing table "TOP_END". The reduction in paths limits the number of entries in this table to sixteen, a number which can be evenly addressed by 4-bit values. This makes it possible to address both tables "TOP_END" and "START_TOP" simply by dividing the input value into two separate binary values. Specifically, bits 0 through 3 of the input value are used to address "TOP_END" and bits 4 through 9 of the input value are used to address "START_TOP".

After the selected bits of the input value have been used to retrieve an 8-bit portion of the codeword representing a path from state 56 to state 62 and a 7-bit codeword portion representing a path from state 62 to state 64, the encoder of the present invention concatenates the 8-bit value and the 7-bit value to produce a 15-bit codeword.

The range of input values from 672 to 1987, inclusive, are assigned to codewords represented by paths passing through state 58 of the trellis diagram of FIG. 2. These paths are constructed from forty-seven paths from state 56 to state 58, and twenty-eight paths from state 58 to state 64. Instead of creating one table with twenty-eight entries representing the paths from decoding state 58, the present invention divides the paths from state 58 into three separate tables of 16, 8, and 4 respectively. These tables are entitled "BOTTOM_END_16", "BOTTOM_END_8", and "BOTTOM_END_4", respectively, and are shown in Appendix A with the codeword portions described by each path aligned under the heading END and aligned with an address used to retrieve the value from the table. The twenty-eight paths from state 58 to state 64 are divided into three tables of 16, 8, and 4 entries, respectively, because each number is evenly addressable by digital values of 4-bits, 3-bits, and 2-bits, respectively. As shown below, this provides a simple way to address the two tables.

The forty-seven pathways from state 56 to state 58 are contained in a single table entitled "START_BOTTOM" found in Appendix A. The codeword portions in "START_BOTTOM" are under the heading START and each is aligned with an address used to retrieve the codeword portion.

If the input value is between 672 and 1423, inclusive, at decision box 102, 672 is subtracted from the input value to create a modified value that is simpler to use in addressing tables "START_BOTTOM" and "BOTTOM_END_16". As with table "TOP_END", the number of values in "BOTTOM_END_16" is specifically chosen to be evenly addressable by a 4-bit digital value. This makes it possible to address "BOTTOM_END_16" using the least significant 4-bits, bits 0 through 3, of the modified value. Bit four through bit nine of the modified value may be used to retrieve the START portion of the codeword from "START_BOTTOM". The 5-bits are sufficient to address the each of forty-seven entries in "START_BOTTOM". After retrieving a value from each table, the two values are concatenated to form a 15-bit codeword with START, the value from "START_BOTTOM", occupying the eight most significant bits and END, the value from "BOTTOM_END_16", occupying the seven least significant bits.

When the input value is greater than 1423 it is compared against decimal value 1800 in decision box 104. If it is less than 1800, the input value is modified by subtracting 1424 to produce a modified value within the range from 0 to 376. Since table "BOTTOM_END_8" has exactly eight entries, it may be evenly addressed by the three least significant bits of the adjusted input value, denoted as bits 0 through 2 in FIG. 3, to retrieve a 7-bit END value. The five most significant bits of the adjusted value denoted as bits 3 through 8 in FIG. 3, can be used to retrieve an eight-bit START value. After the START and END values have been retrieved from the two tables, the values are concatenated with the 8-bit START value occupying the most significant bits of the 15-bit codeword.

If the input value is greater than 1799, it is compared against the decimal value 1988 in decision box 106 of FIG. 3. If the input value is less than 1988 at decision box 106, 1,800 is subtracted from the value to produce a number within the range of 0 to 187, which may be used to address tables "START_BOTTOM" and "BOTTOM_END_4". As discussed above, because table "BOTTOM_END_4" has exactly four entries, it may be evenly addressed by two-bit values. Thus, the two least significant bits of the adjusted input value, bits 0 and 1, are used to retrieve the 7-bit codeword portion END, found in "BOTTOM_END_4". Bits 2 through 7 of the adjusted input value are used to address table "START_BOTTOM" to retrieve the 8-bit codeword portion START. To produce the 15-bit codeword the 8-bit START value is concatenated with the 7-bit END value.

If the input value is greater than 1987 at box 106, it is compared with the decimal value 2048 in decision box 108. If the input value is less than 2048, the input value is adjusted by subtracting 1988 to produce an adjusted value for addressing table "FULL_CENTER" which contains 15-bit codewords, as shown in Appendix A. The adjusted input value has a range of possible values from 0 to 59 and each of the possible adjusted values has its own entry in table "FULL_CENTER" which is addressed using the six least significant bits of the adjusted value.

The codewords listed in table "FULL_CENTER" each end with a 7-bit codeword portion ("1101000") associated with a path from state 60 to state 64 of FIG. 2. Thus, all of the codewords of "FULL_CENTER" use one path from state 60 to state 64 in FIG. 2 leaving the remaining 32 paths from state 60 to state 64 unassigned.

If the input value is greater than 2047 at decision box 108, it is checked against nine input values that would retrieve invalid codewords from tables "START_CNTR" and "CNTR_END". These invalid codewords arise because of the concatenation of two separate portions of the codewords which by themselves are valid. The nine inputs which would create these invalid codewords have the following binary and decimal values:

| | |
|---|---|
| 10000000000 | 2048; |
| 10000000001 | 2049; |
| 10000000010 | 2050; |
| 10000100000 | 2080; |
| 10000100001 | 2081; |
| 10000100010 | 2082; |
| 10001000000 | 3112; |
| 10001000001 | 3113; |
| 10001000010 | 3114; |

Since these nine number would retrieve invalid codewords if used in the method described below using tables "START_CNTR" and "CNTR_END", a separate table is provided to retrieve valid codeword replacements. Three of the replacement codewords are represented by paths passing through state 60 that end with the same code portion that is found at the end of each codeword of table "FULL_CENTER". Since table "FULL_CENTER" only uses sixty of the possible sixty-four codewords that end with this code portion, four codewords ending with this portion are left unassigned by "FULL_CENTER".

The remaining six replacement codewords are represented by pathways that pass through state 62, which are not assigned to input values that are between 0 and 671. These codewords each include a beginning code portion, "00011111", represented by a path from state 56 to state 62 that was eliminated from "START_TOP". The six replacement codewords that are reclaimed using this eliminated path are constructed from a concatenation of this code portion with code portions that are carefully chosen so that they will not produce invalid codewords.

The nine replacement codewords are listed in table "REPLACE" of Appendix A and are fully addressed by 4-bit values. The 4-bit values consist of bits 6, 5, 1 and 0 of the input value in order of decreasing significance. These four bits distinguish each of the nine input values that would create invalid codewords if used in the method described below for tables "START_CNTR" and "CNTR_END". Once it has been determined that the input value is one of the values that would create an invalid codeword, bits 6, 5, 1 and 0 are used to retrieve a codeword from table "REPLACE".

If the input value is determined to be a value that does not create invalid codewords at decision box 110, the input value is used to retrieve code portions from tables "START_CNTR" and table "CNTR_END" of Appendix A. Table "START_CNTR" includes code portions represented by the sixty-four paths from state 56 to state 60. Table "CNTR_END" includes thirty-two of the thirty-three codewords represented by paths from state 60 to state 64. Because thirty-two and sixty-four are both powers of two, each is evenly addressable by a digital value. Specifically, each of the thirty-two codewords of table "CNTR_END" can be uniquely addressed by a 5-bit digital value, and each of the sixty-four codeword portions in table "START_CNTR" can be addressed by a 6-bit digital value. This provides a simple implementation to retrieve the codeword portions by using different bits of the input value. Specifically, the five least significant bits of the input value can be used to address table "CNTR_END" to retrieve the END portion represented by a path from state 60 to state 62, and the next six significant bits above the first five least significant bits can be used to address table "START_CNTR" to retrieve the START portion of the codeword represented by a path from state 56 to state 60. The most significant bit in the input value is not needed during the addressing since it has already been established that all values that address tables "START_CNTR" and "CNTR_END" are greater than or equal to 2048, which means that their digital values all have a "1" for their most significant bit. After code portions START and END are retrieved from the tables, they are concatenated with the START portion occupying the eight most significant bits of the 15-bit codeword.

Although the values above have been described as being stored in tables, the encoding described above may be implemented directly without using tables. In a direct implementation, the addressing values are applied directly to logic which is hard-wired to give the output values that are described above as being retrieved. Since the logic components must be properly set before encoding, the output values may still be considered preset values since they are automatically output for a given input.

Figure 4A:
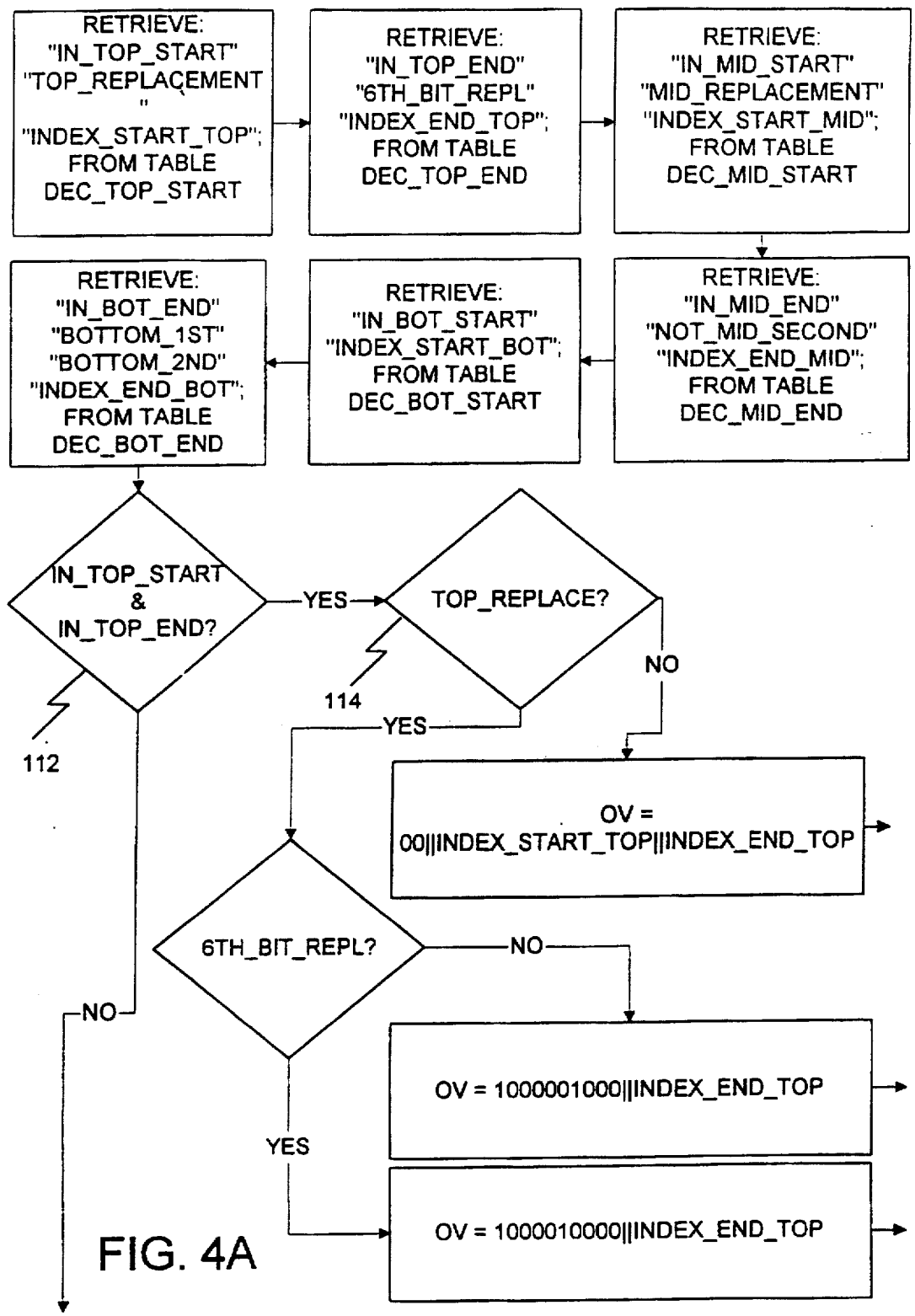
FIGS. 4A through 4C are a flow chart of a decoding method for use with the encoding method of FIG. 3.
Figure 4B:
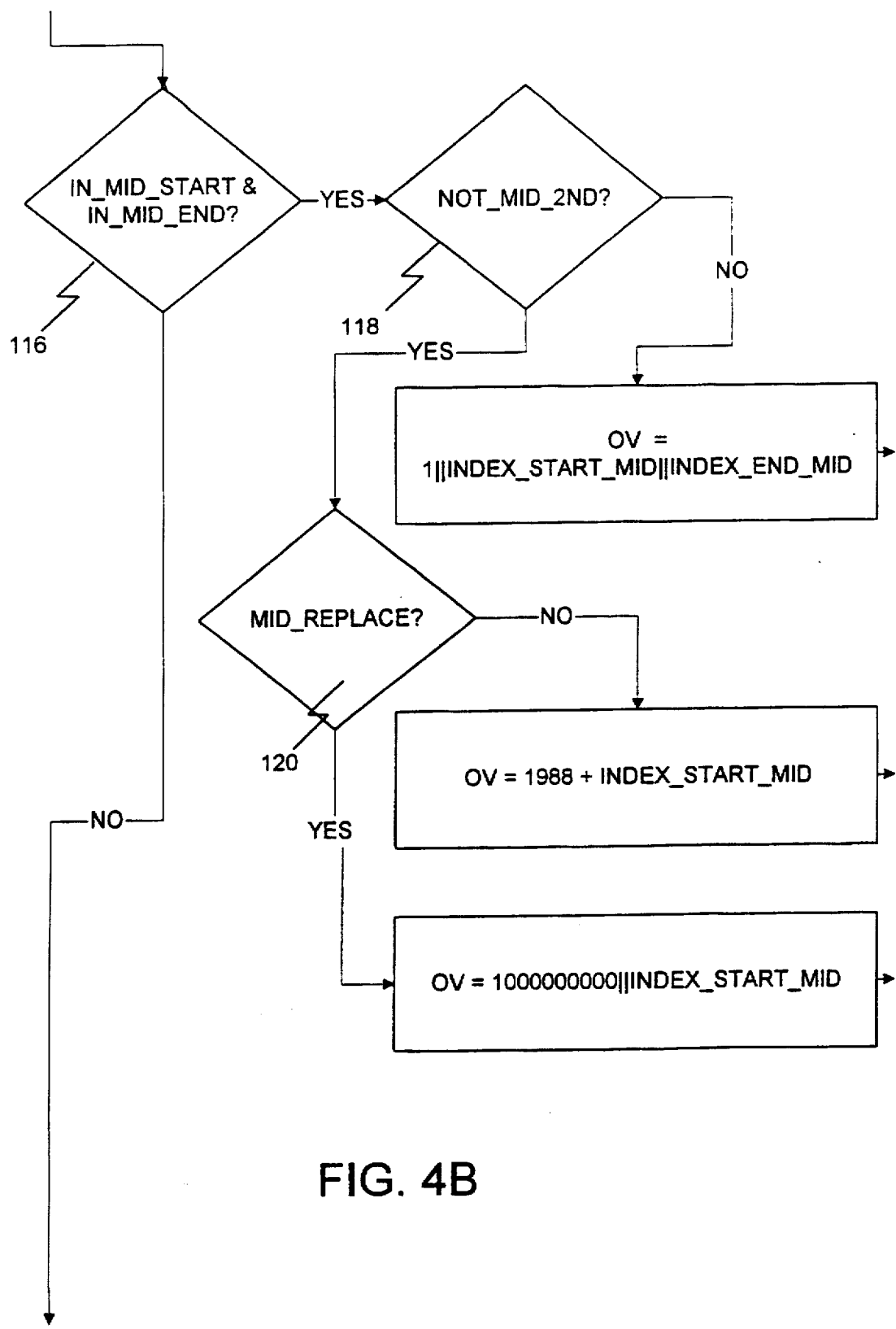
Figure 4C:
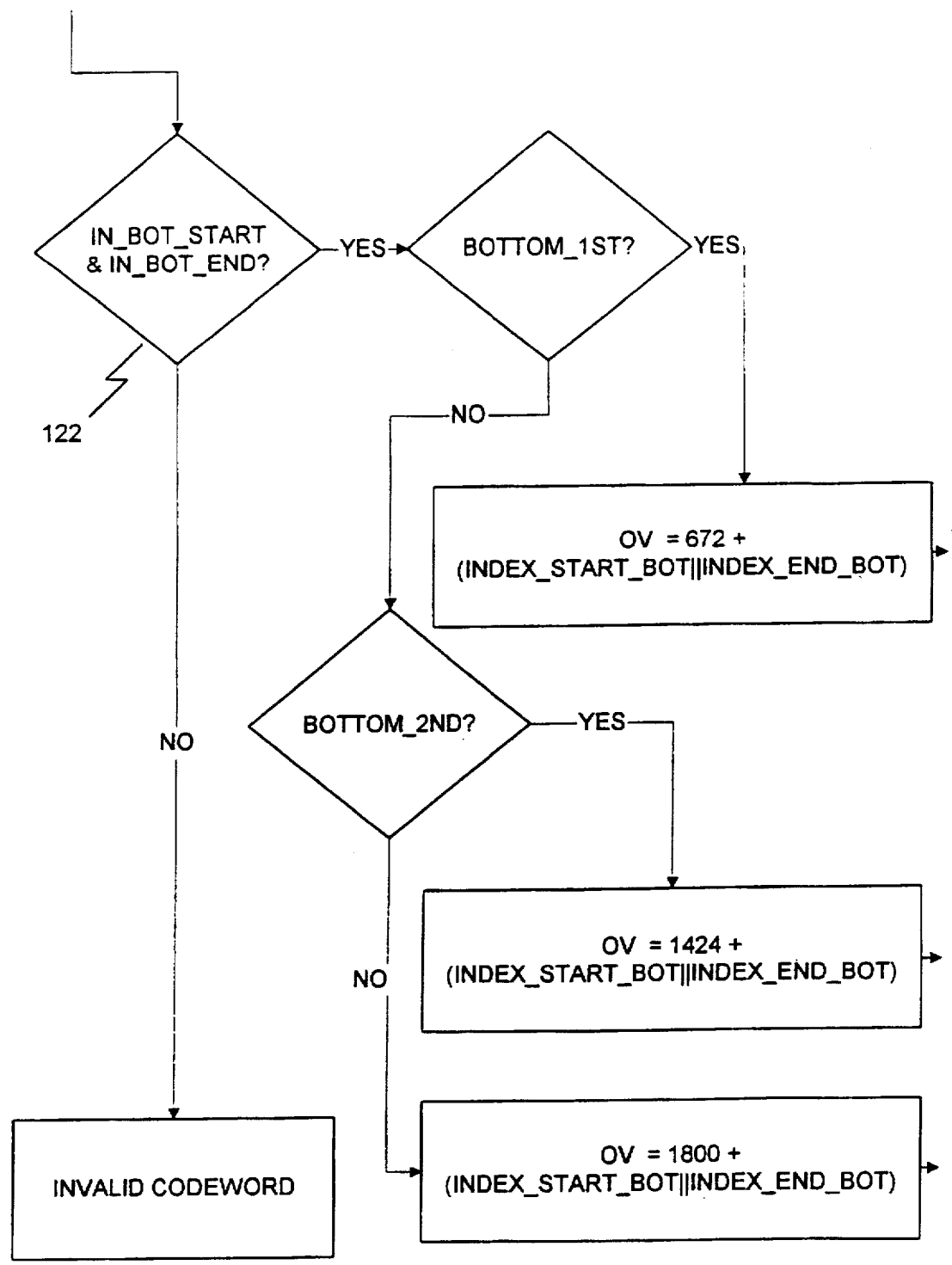

FIGS. 4A–4C are a flow chart of a method of decoding for use in with the first embodiment of the present invention described in FIG. 3. The decoding method begins by retrieving the values of several variables from six different tables shown in Appendix A. Although these tables appear as rows and columns of elements, they may be implemented directly using synthesized simple logic. Three of the tables, DEC_TOP_START, DEC_MID_START, and DEC_BOT_START are addressed by the eight most significant bits of the codeword. Tables DEC_TOP_END, DEC_MID_END, and DEC_BOT_END are addressed by the seven least significant bits of the input codeword. The values retrieved from each of the tables described above, will be described below as they are used by the decoder.

After the values are retrieved from the tables, the decoder determines whether the codeword's 8-bit most significant portion and 7-bit least significant portion were found in DEC_TOP_START and DEC_TOP_END respectively. If the codeword portions were found in these tables, variables IN_TOP_START and IN_TOP_END will each have a value of 1 at decision block 112. If the values of IN_TOP_START and IN_TOP_END are 1 the decoder determines whether the codeword is a replacement codeword for an invalid codeword. This is determined in decision block 114 which looks at variable TOP_REPLACE from table DEC_TOP_START. TOP_REPLACE has a value of 1 if the codeword replaced an invalid code word during encoding, and a 0 if the codeword was not a replacement.

If the codeword was not a replacement, the output value is constructed by concatenating the four least significant bits of INDEX_END_TOP with the six least significant bits of INDEX_START_TOP and further with the value "00". The values in INDEX_START_TOP and INDEX_END_TOP are taken from tables DEC_TOP_START and DEC_TOP_END, respectively, and each represents an inverse mapping of the input-value-to-codeword mapping used during the encoding described in FIG. 3. The concatenation places the value "00" in the most significant positions of the output value and places the value from INDEX_END_TOP in the least significant positions.

If the codeword is determined to be a replacement codeword in decision box 114, the value in 6TH_BIT_REPL is examined to determine the type of input value associated with the replacement codeword. 6TH_BIT_REPL is retrieved from table DEC_TOP_END, and has a value of 0 if the output value is to be formed by concatenating the two least significant bits of INDEX_END_TOP to the least significant bit of binary value "1000001000", so that two bits of INDEX_END_TOP occur in the least significant bit positions of the output value. If the value of 6TH_BIT_REPL is 1, the output value (OV) is the concatenation of the two least significant bits in INDEX_END_TOP and 10-bit binary value "1000010000", with the binary value occupying the most significant positions of the output value.

If the codeword portions are not in tables DEC_TOP_START and DEC_TOP_END at decision box 112, the decoder determines whether the eight most significant bits and seven least significant bits of the codeword are in tables DEC_MID_START and DEC_MID_END, respectively, at decision box 116 of FIG. 4B. To determine whether the codewords are within these tables, the decoder looks to the values in IN_MID_START and IN_MID_END, which indicate whether the codeword portions were found in tables DEC_MID_START and DEC_MID_END, respectively.

If the codeword portions are found in tables DEC_MID_START and DEC_MID_END, the decoder determines whether the codeword is a member of a particular group of codewords by examining the value of variable NOT_MID_2ND taken from table DEC_MID_END. A 0 in NOT_MID_2ND indicates that the codeword is part of a group of codewords that were constructed from input values between 2048 and 4095, inclusive, in the encoding method by FIG. 3. For codewords in this group, the output value (OV) is constructed by concatenating the least significant five bits of INDEX_END_MID retrieved from DEC_MID_END, with the least significant six-bits of INDEX_START_MID retrieved from DEC_MID_START. This concatenated value is further concatenated with the binary value "1", so that the binary value "1" is the most significant bit of the output value and the value in INDEX_END_MID occupies the least significant bits of the output value. The values INDEX_END_MID and INDEX_START_MID represent an inverse mapping of the encoding map used to construct the codewords in the encoder of FIG. 3.

If the codeword is not a member of the particular group described above, NOT_MID_2ND has a value of 1 and the decoder advances to decision box 120, where it determines whether the codeword was a replacement codeword. If the codeword is not replacement codeword, the value in MID_REPLACE retrieved from table DEC_MID_START, is 0. For codewords that are not replacement codewords, the output value (OV) is equal to the binary equivalent of the decimal value "1988" added to the binary value in INDEX_START_MID retrieved from DEC_MID_START. If the codeword is a replacement codeword, indicated by a 1 in MID_REPLACE, the output value (OV) is equal to the two least significant bits of INDEX_START_MID concatenated with the binary value "1000000000"; the 10-bit binary value occupying the most significant positions of the output value.

If the codeword portions are not found in DEC_MID_START and DEC_MID_END at decision box 116, the decoder determines whether the eight most significant bits and seven least significant bits of the codeword are located in tables DEC_BOT_START and DEC_BOT_END, at decision box 122 of FIG. 4C. If the eight most significant bits are found in table DEC_BOT_START, the value in IN_BOT_START is 1 and if the seven least significant bits of the codeword are found in table DEC_BOT_END, the value in IN_BOT_END, is 1. If these codeword portions are not found in their respective tables, the input codeword is determined to be invalid, since its portions were not found in any of the tables containing valid codeword combinations.

If the respective codeword portions were found in tables DEC_BOT_START and DEC_BOT_END, the decoder determines which of three codeword sets the codeword belongs to. If the codeword belongs to a first set of codewords, the variable BOTTOM_1ST from table DEC_BOT_END is 1.

For codewords from the first set of codewords, the output value (OV) is equal to the binary equivalent of 672 added to the concatenation of the six least significant bits of INDEX_START_BOT and the four least significant bits of INDEX_END_BOT, which are inverse mappings of the encoding mapping of FIG. 3 and which are taken from tables DEC_BOT_START and DEC_BOT_END, respectively.

If the codeword is not part of the first set of codewords, the decoder determines whether the codeword is part of a second set of codewords by examining the value of BOTTOM_2ND retrieved from table DEC_BOT_END. If the codeword is part of the second set of codewords, the value of BOTTOM_2ND will be 1 and the output value (OV) will be equal to the binary equivalent of 1424 added to the concatenation of the least significant bits of INDEX_START_BOT and the least significant three bits of INDEX_END_BOT.

If the decoder determines that the codeword is not part of the second set of codewords, the output value (OV) is equal to the binary equivalent of 1800 added to the concatenation of the six least significant bits of INDEX_START_BOT with the two least significant bits of INDEX_END_BOT.

Through the decoding method described above in FIGS. 4A through 4C, the present invention is able to decode the codewords produced through the method described in FIG. 3.

Figure 5:
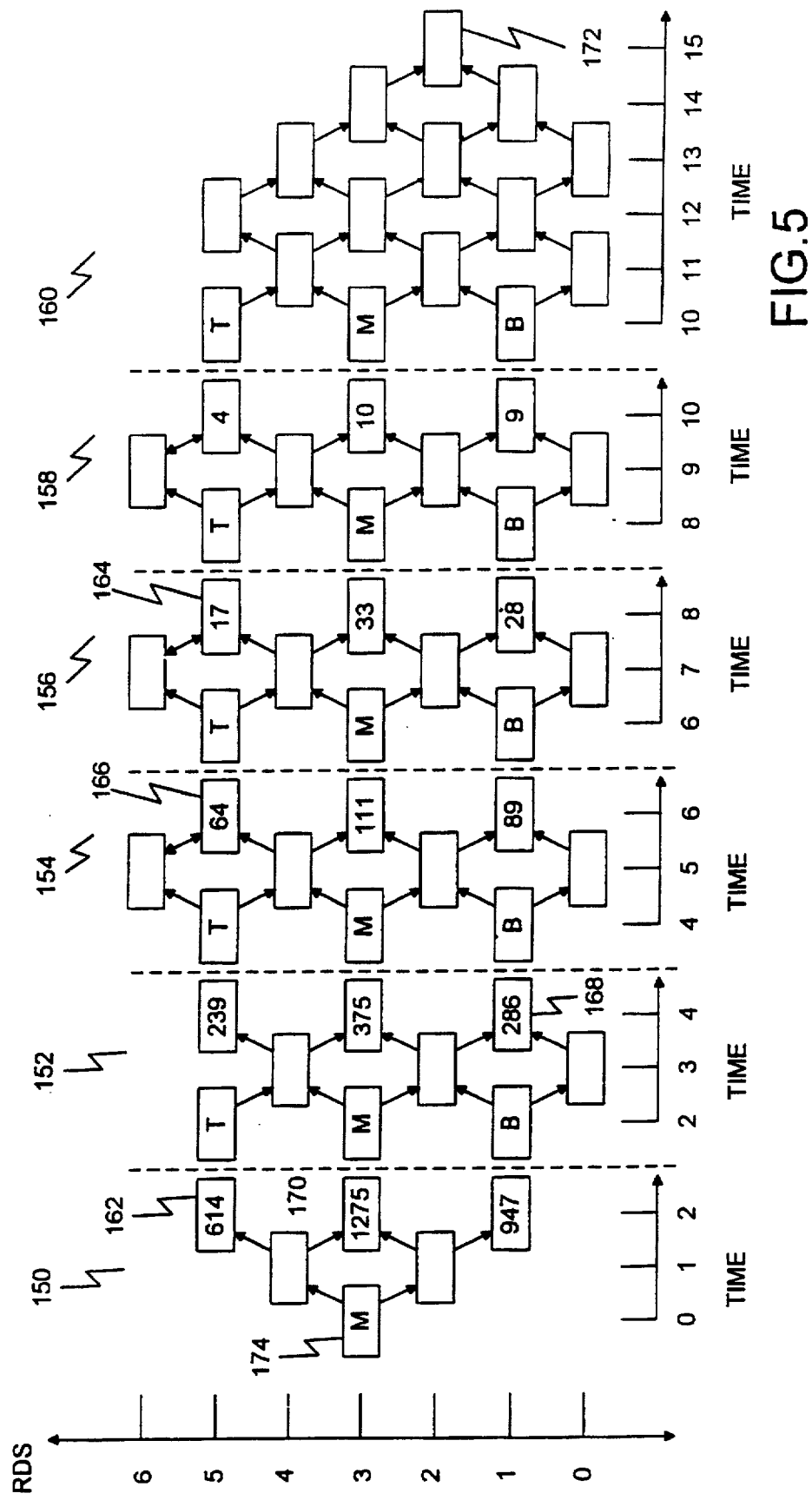
FIG. 5 is a divided trellis diagram illustrating the second embodiment of the present invention.

FIG. 5 is a modified version of the trellis diagram of FIG. 2, and is useful in understanding the second embodiment of the present invention. FIG. 5 shows the trellis diagram divided into six partitions: first partition 150, second partition 152, third partition 154, fourth partition 156, fifth partition 158 and sixth partition 160. The partitions are separated by dotted lines with boxes representing trellis encoder states to each side of the partition line. The boxes to either side of a partition line at a particular running digital sum represent the same state and are merely separated to facilitate the description of the present invention.

The states at the beginning of a partition are designated as RDS states "B", "M" or "T", depending on their running digital sum. For instance, when the encoder has a running digital sum of 5 at the beginning of third partition 154, it is said to be in RDS state "T". The RDS state of the encoder at the beginning of each partition is listed in the boxes corresponding to the state of the encoder. RDS sates of "T", "M", and "B", correspond to running digital sums of 5, 3, and 1, respectively.

The boxes denoting the end states of each partition include numbers signifying the number of paths from that state to state 172 at the end of the trellis diagram. For instance, state 162 at time period 2 contains the number 614 because there are 614 paths from state 162 to state 172 which represent valid codewords. The number of paths listed in each ending state of each partition is the number of paths that create valid codewords. Codewords which violate the six consecutive same symbol constraint are specifically excluded. Since the number of pathways listed in the state boxes of FIG. 5 do not include invalid codewords, there are actually more pathways from some of the state boxes than indicated in FIG. 5. For instance, there are actually 18 paths from state 164, but only 17 of the paths create valid codewords that do not violate the six consecutive same symbol constraint. Therefore, state box 164 indicates that there are only 17 paths from state 164 to state 172.

The first five partitions of the trellis diagram of FIG. 5 each represent two bits in the codeword. The sixth partition represents five bits in the codeword. In the second embodiment of the present invention, the codewords are constructed by recursively selecting two bit segments and concatenating the two bit segments together to form the first 10-bit segment. This 10-bit segment is concatenate with a 5-bit segment that is selected based upon the RDS state of the encoder at the time it reaches the beginning of sixth partition 160. Each recursive partition selects is 2-bit value based on a comparison between an input value or modified input value and one or more threshold values.

In some partitions, the selections are made so as to eliminate codewords that would violate the six consecutive same symbol constraint. In most instances, this is accomplished by restricting access to the portions of the trellis diagram that represent what can become the beginning of an invalid sequence and by giving preference to code bit sequences that avoid invalid codewords. For instance, third partition 154 only assigns 64 input values to the path representing "01" from RDS state "T", even though there are 69 possible pathways that begin with "01" from that RDS state. Since only 64 assignments are made, and there are exactly 64 valid sequences from that RDS state invalid sequences can be avoided by giving preference to those paths which do not violate the six consecutive same symbol constraint. This preference is accomplished by ordering the paths for assignment so that the paths that do not violate the six consecutive same symbol constraint are assigned before the paths that violate the constraint. This causes the invalid codewords to be left unassigned since the restricted access to the beginning of the path has redirected input values that would otherwise be assigned to the invalid codewords.

The second embodiment's method of giving preference to certain codewords by forming ordered lists in each partition is complicated by the fact that in fourth partition 156, two pathways, which can create invalid codewords, cross at state 164. Because the two pathways cross, there are two different preferences at the crossing. Specifically, the pathway which enters state 164 on a downward diagonal arrow indicating a zero in the codeword, would prefer to assign its input value to the pathway which exits state 164 on an upward diagonal arrow indicating a I in the codeword. On the other hand, the pathways that enter state 164 on an upward diagonal arrow indicating a 1 in the codeword would normally operate best if preference were given to pathways that leave state 164 on a downward diagonal arrow indicating the introduction of 0 in the codeword. To overcome this conflict, the present invention insures that none of the possible inputs reach state 164 after having five consecutive 1's. This is accomplished by limiting the number of codewords which may be constructed through state 168 to insure that after giving preference to pathways that introduce zeros into the codeword in partitions 154 and 156, all of the possible input values will be assigned before reaching state 164 from state 168.

FIGS. 6A through 6J are a continuous flow chart of the method of the second embodiment of the present invention. The method begins in FIG. 6A at assignment box 180, where the input user data is assigned to a variable R, three threshold values, t0, t1 and t2 are set to 614, (614+1275) and (614+1275+1275); and a RDS state variable STATE is set to "M". The threshold values set in assignment box 180 are constructed from values that correspond to the number of pathways through state 162 and state 170 of FIG. 5. Threshold t0 is set to 614 to indicate that the first 614 user values are assigned to state 162. Threshold t1 is set to 614 plus 1275 to indicate that the next 1275 values are assigned to state 170 through a path from beginning state 174 that includes codebits 10. Threshold t2 is an additional 1275 greater than the value of threshold t1 to indicate that the next 1275 values are assigned to state 170 through a path that represent codebits 01 on the trellis diagram of FIG. 5.

Figure 6A:
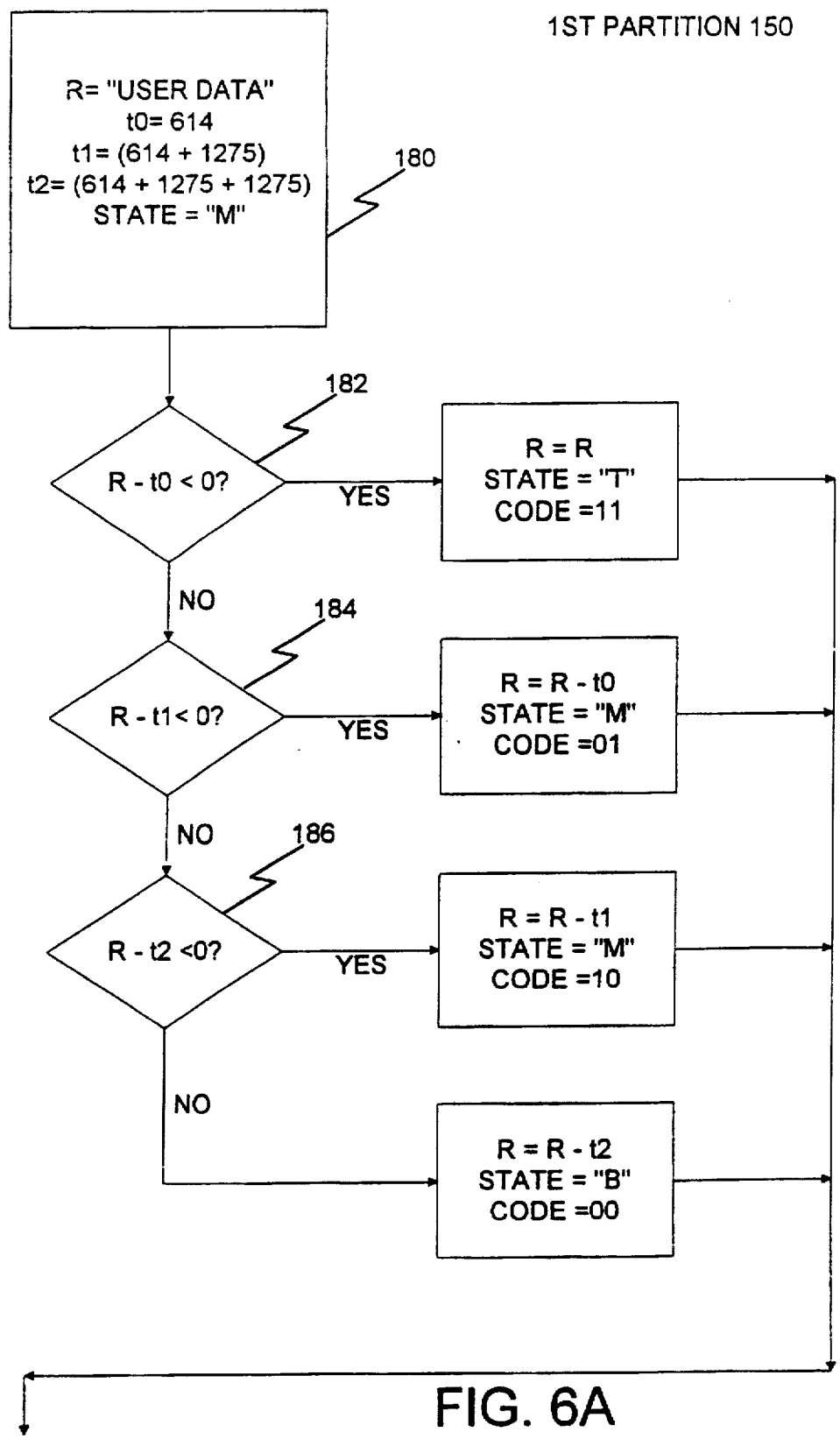
FIG. 6A is a flow chart of a first recursive partition of the second method of the present invention.

These relationships are shown in FIG. 6A where the encoding is performed through a series of decision boxes 182, 184 and 186. In decision box 182, if the input value is less than t0 (614), the first partition assigns "11" to variable CODE, which will eventually contain the entire codeword. In addition, STATE is changed from a state of "M" to a state of "T" to indicate that the encoder has reached a running digital sum of 1 and is in state 162 of the trellis diagram of FIG. 5.

If the input value is equal to or greater than t0 (614), it is compared against t1 (614+1275) in decision box 184. If the input value is less than t1, CODE is set to "01" and STATE is set to "M". The input value is also modified by subtracting t0 (614) and storing the new value in the variable R. This ensures that when the encoder's STATE is "M" at the beginning of the second partition, the values in R will be between 0 and 1275. If the input value is greater than or equal to t1, it is compared against t2 (614+1275+1275) in decision box 186. If the input value is less than t2, "10" is assigned to CODE and "M" is assigned to STATE. In addition, t1 (614+1275) is subtracted from the input value and assigned to R. This subtraction ensures that the value of R will have a range of values from 0 to 1275 when STATE equals "M" at the beginning of the second partition. If the input value is greater than or equal to t2 (614+1275+1275), "00" is assigned to CODE and "B" is assigned to STATE. In addition, t2 is subtracted from the input value and the result is assigned to R so that the range of possible values for R begins at 0 when state equals "B" at the beginning of partition 152.

Figure 6B:
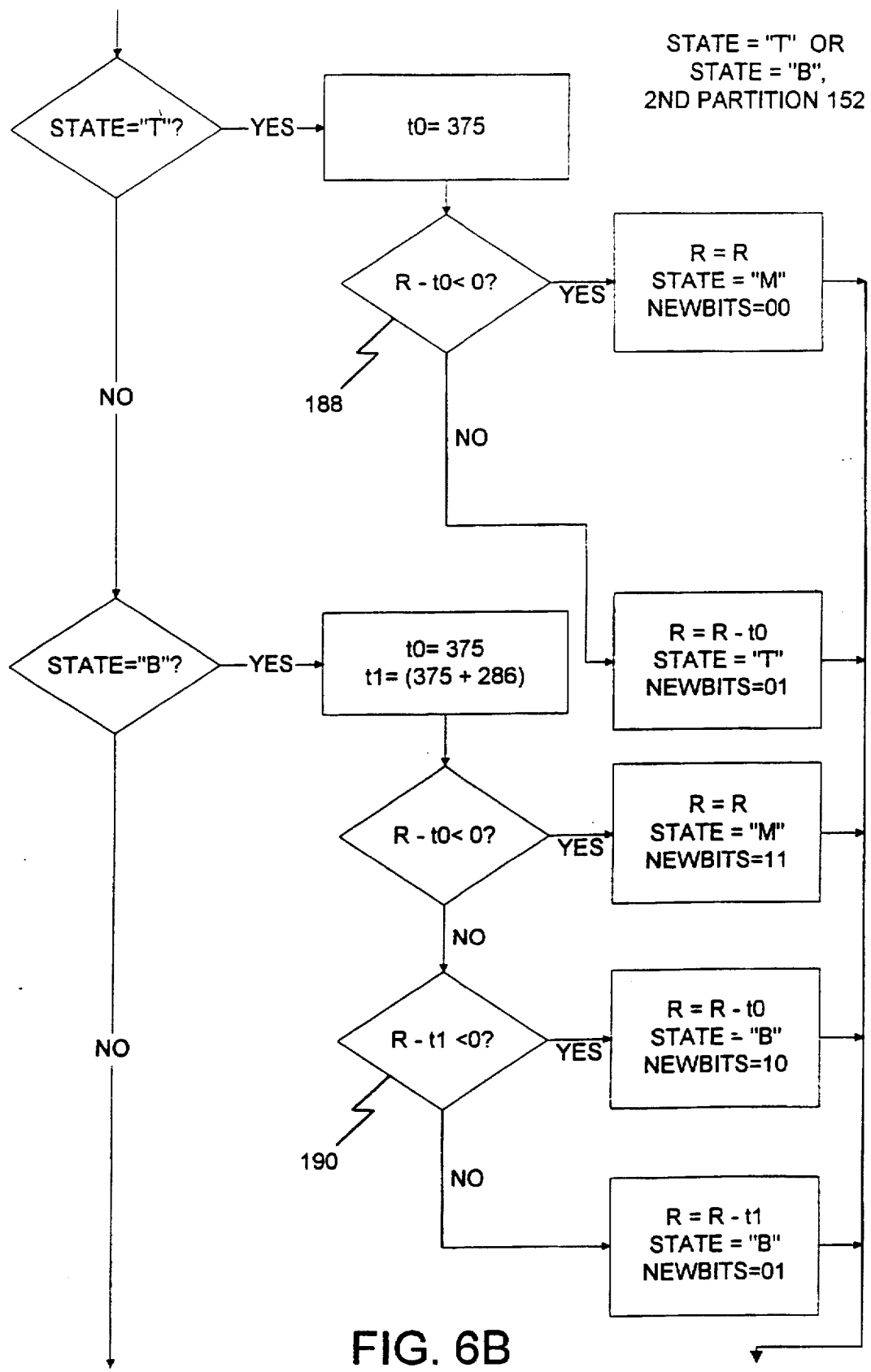
FIG. 6B is a flow chart of a second recursive partition of the second embodiment of the present invention for trellis states "T" and "B".
Figure 6C:
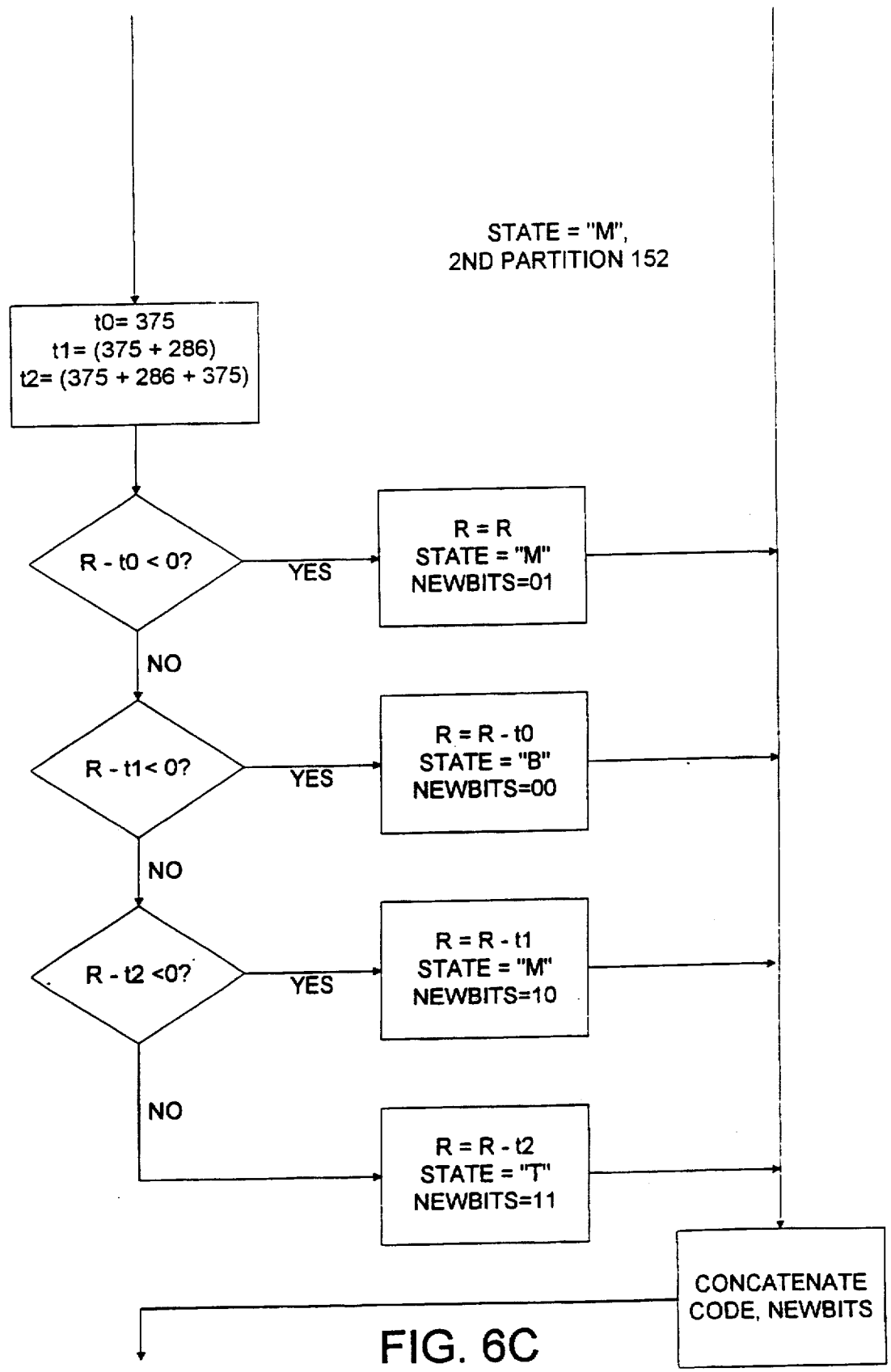
FIG. 6C is a flow chart for the second recursive partition of the second embodiment of the present invention for a trellis state "M".

The flow chart for second partition 152 is shown in FIGS. 6B and 6C. The method of encoding used in the second partition is dependent upon STATE, which indicates the current running digital sum of the encoder. If STATE is set to "T", indicating a running digital sum of 5, threshold value t0 is set to 375 and the encoder advances to decision box 188 where the value of R is compared with t0. If the value stored in R is less than t0, STATE changes to "M" and the variable NEWBITS is set to "00", indicating a path along the trellis of FIG. 5 that follows two downward diagonal arrows. As discussed below, the value of NEWBITS is concatenated with the value of CODE to create the first four bits of the codeword.

If R is greater than or equal to t0 (375) at decision box 188.

STATE remains at "T" and "01" is stored in the variable NEWBITS. In addition t0 (375) is subtracted from the values stored in R and the result is placed in R.

The adjustment to R insures that R has values between 0 and 239 when STATE is "T" at the beginning of third partition 154.

If at the beginning of second partition 152 STATE has a value of "B", threshold value t0 is set to 375 and threshold t1 is set to (375+286). The value of R is compared against threshold value t0 and if R is less than t0, STATE changes to "M" and "11" is stored in NEWBITS. If the value in R is greater than or equal to t0 (375), it is compared with threshold value t1 (375+286) in decision box 190. If R is less than t1, the value of STATE remains at "B" and "10" is stored in NEWBITS. In addition, R is changed to the value of R at the beginning of the partition minus t0 (375). This ensures that the value of R will be in the range between 0 and 286 when STATE is "B" at the beginning of third partition 154.

If the value of R is greater than or equal to t1 (375+286) at decision box 190, R is adjusted to a value of R-t1, STATE remains at "B" and a value of "01" is stored in NEWBITS.

If STATE has a value of "M" at the beginning of second partition 152, as shown in FIG. 6C, threshold values t0, t1 and t2 are set to 375 (375+286), and (375+286+375), respectively. The value of R is then compared against the three threshold values with the outcome of the comparisons determining the values to be set in the variables R, STATE, and NEWBITS. If R is less than t0 (375), R and STATE retain their values and NEW BITS receives a value of "01".

If R is greater than t0, but less than t1 (375+286), STATE changes to "B", NEWBITS receives a value of "00", and R is modified to a value of R-t0 (375). The modification to R ensures that R will have a value between 0 and 286 if STATE equals "B" at the beginning of third partition 154.

If the value in R is greater than or equal to t1 (375+286), the value is compared with threshold value t2 (375+286+375). For values of R that are less than t2, but greater than t1, the encoder's RDS STATE remains in state "M" and "10" is stored in NEWBITS. In addition, the value in R is modified to R-t1. If the value of R is greater than or equal to t2, STATE changes to "T" and "1" is stored in NEWBITS. For values of R greater than or equal to t2, R is modified to a value of R-t2.

At the end of the second partition, regardless of which state the encoder is in at the end of the second partition or what state it was in at the beginning of the partition, the value in NEWBITS is concatenated with the value in CODE to produce a 4-bit portion of the codeword, which is stored in CODE.

Figure 6D:
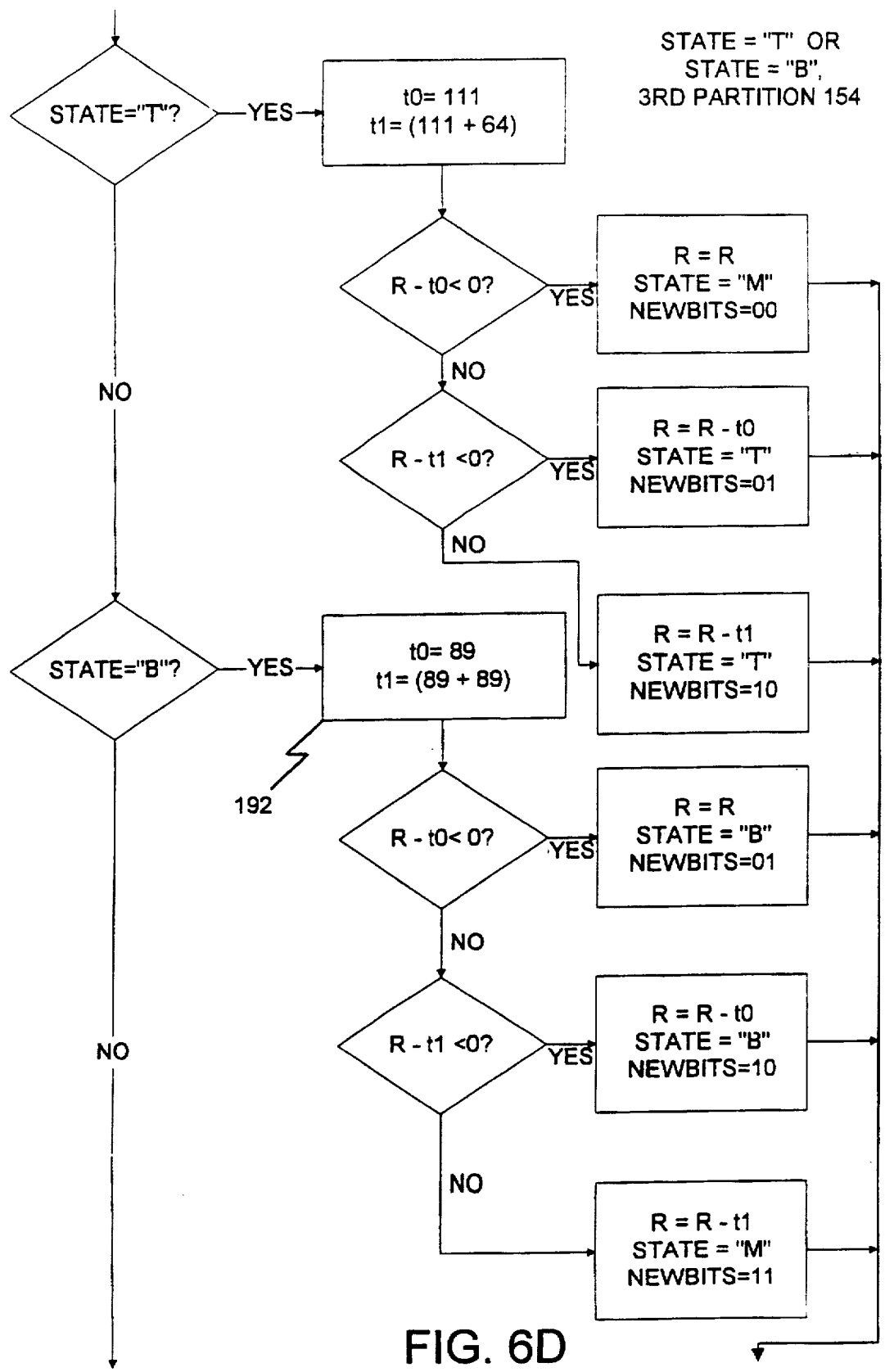
FIG. 6D is a flow chart of a third recursive partition of the second embodiment of the present invention for a trellis state "T" or "B".
Figure 6E:
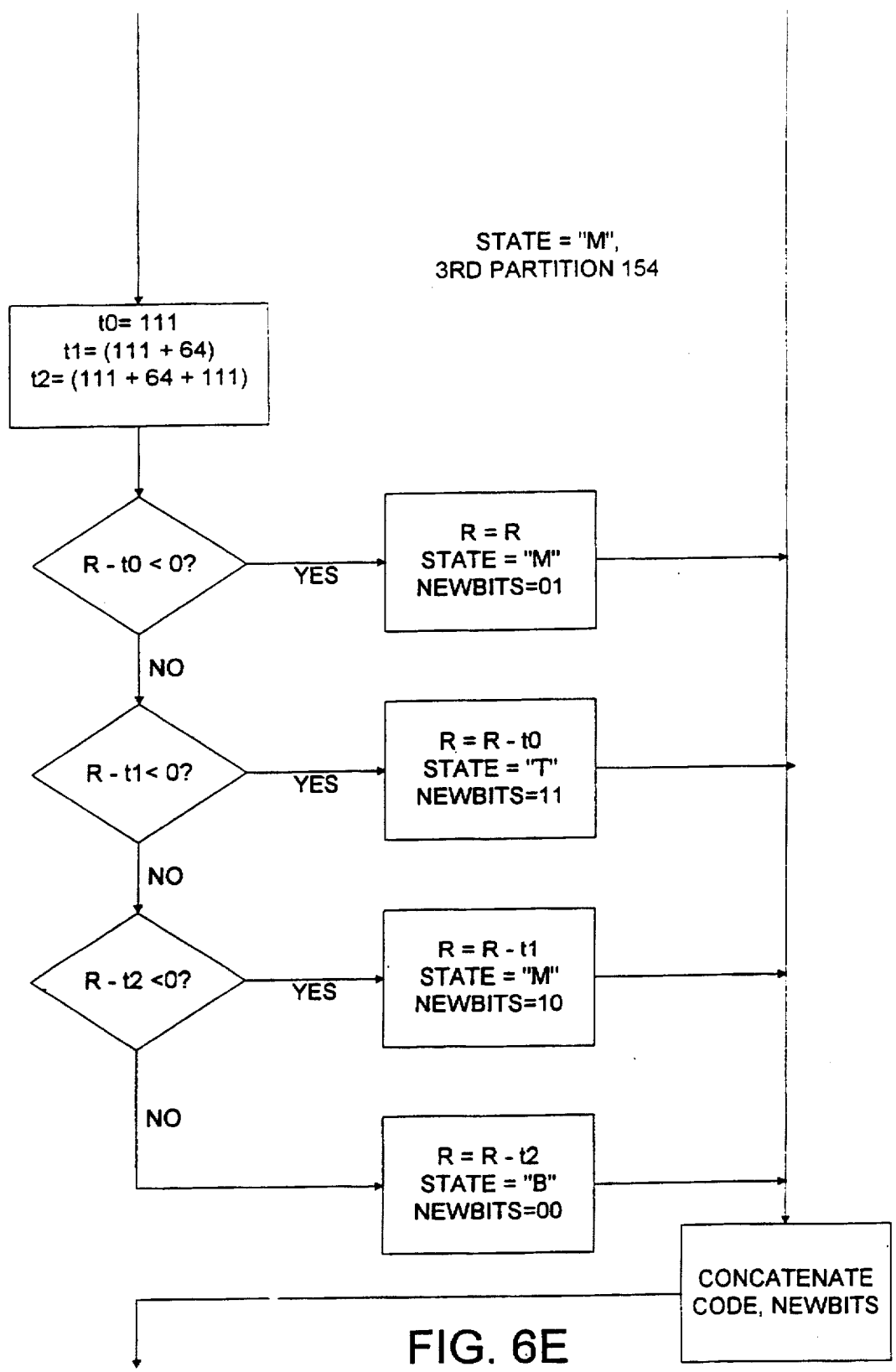
FIG. 6E is a flow chart of a third recursive partition of the second embodiment of the present invention for a trellis state "M".

FIGS. 6D and 6E are flow diagrams of the third partition of the second embodiment of the present invention. If STATE is "T" at the beginning of the third partition, threshold values t0 and t1 are set to 111 and (111+64) respectively. The value stored in R is then compared against the two threshold values. If R is less than t0 (111), "00" is stored in NEWBITS and "M" is stored in STATE. If the value in R is greater than or equal to t0 but less than t1 (111+64) "01" is stored in NEWBITS and "T" is stored in STATE. In addition, the value in R is modified to the value of R at the beginning of the partition minus t0. If the value stored in R is greater than or equal to t1 (111+64) NEWBITS is set to "10", STATE is set to "T" and the value in R is adjusted to R-t1.

If the encoder is in state "B" at the beginning of partition 154, threshold value t0 is set to 89 and threshold value t1 is set to (89+89) as shown in assignment box 192. If the value in R is less than t0, STATE remains at "B" and "01" is placed in NEWBITS. If the value in R is greater than t0, but less than t1, STATE remains at "B", "10" is stored in the variable NEWBITS, and the value in R is modified to R-t0. If the value of R is greater than t1 (89+89), the encoder changes states so that STATE equals "M". 11 is stored in NEWBITS, and R is modified to R-t1.

As shown in FIG. 6E, if STATE is "M" at the beginning of third partition 154, threshold values t0, t1 and t2 are set to 111, (111+64), and (111+64+111), respectively. For values of R less than t0, STATE remains at "M" and "01" is stored in NEWBITS. For values of R greater than or equal to t0, but less than t1, STATE changes to "T", "11" is stored in NEWBITS, and the value of R is modified to the value of R at the beginning of the third partition minus t0. When the value of R at the beginning of the third partition is greater than or equal to t1 (111+64), but less than t2 (111+64+111), the encoder's STATE is "M", NEWBITS is set to "10", and the value of R is modified to R-t1. If the value of R at the beginning of the third partition is greater than t2, the encoder changes STATE to "B", NEWBITS is set to "00", and R is modified to R-t2.

At the end of the third partition, the two bit value in NEWBITS is concatenated with the 4-bit value in CODE to form a 6-bit value. The concatenation is such that the 2-bit value in NEWBITS is placed at the end of the 4-bit value CODE. The new 6-bit value is again stored in CODE.

Figure 6F:
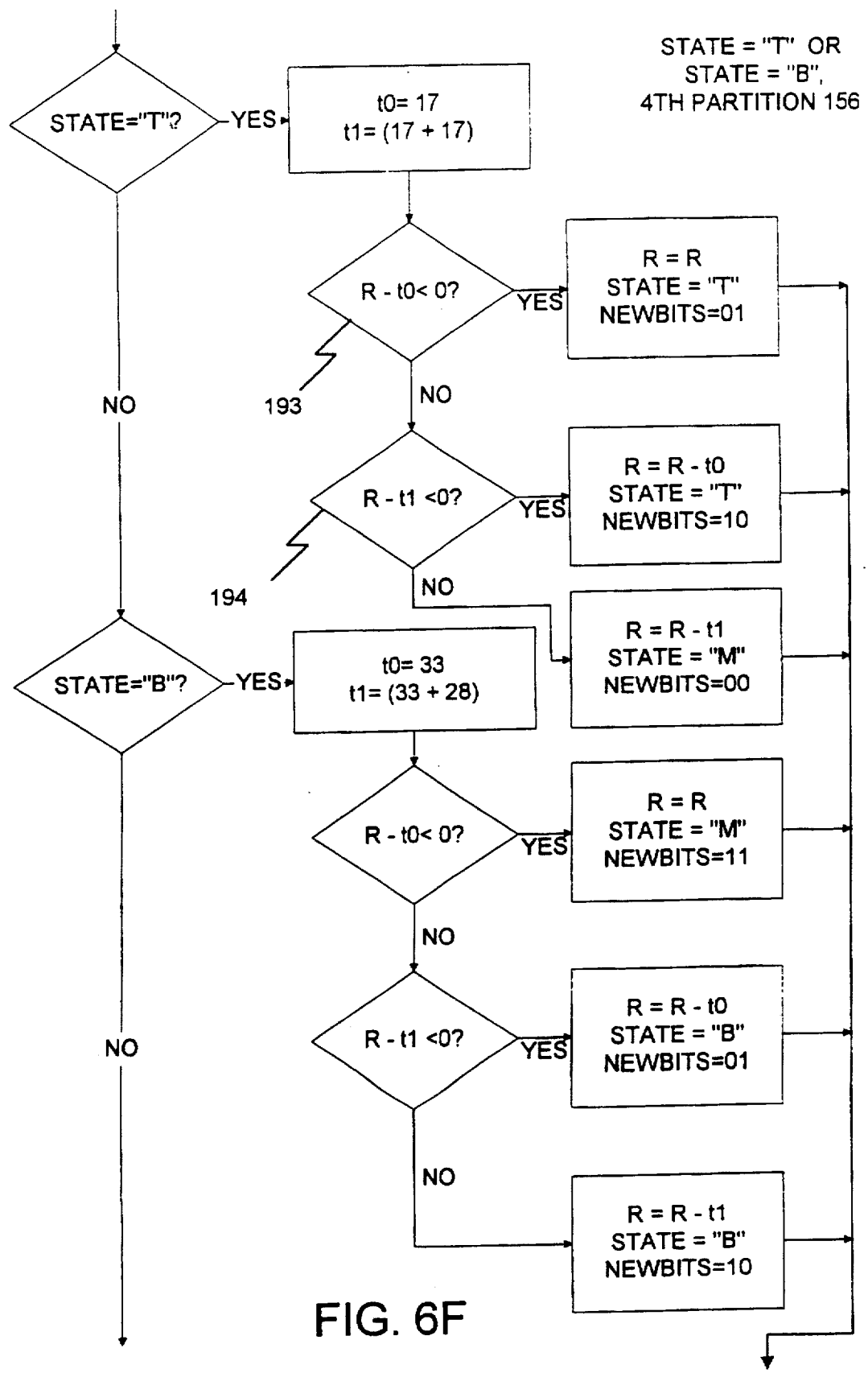
FIG. 6F is a flow chart of a fourth recursive partition of the second embodiment of the present invention for a trellis state of "T" or "B".
Figure 6G:
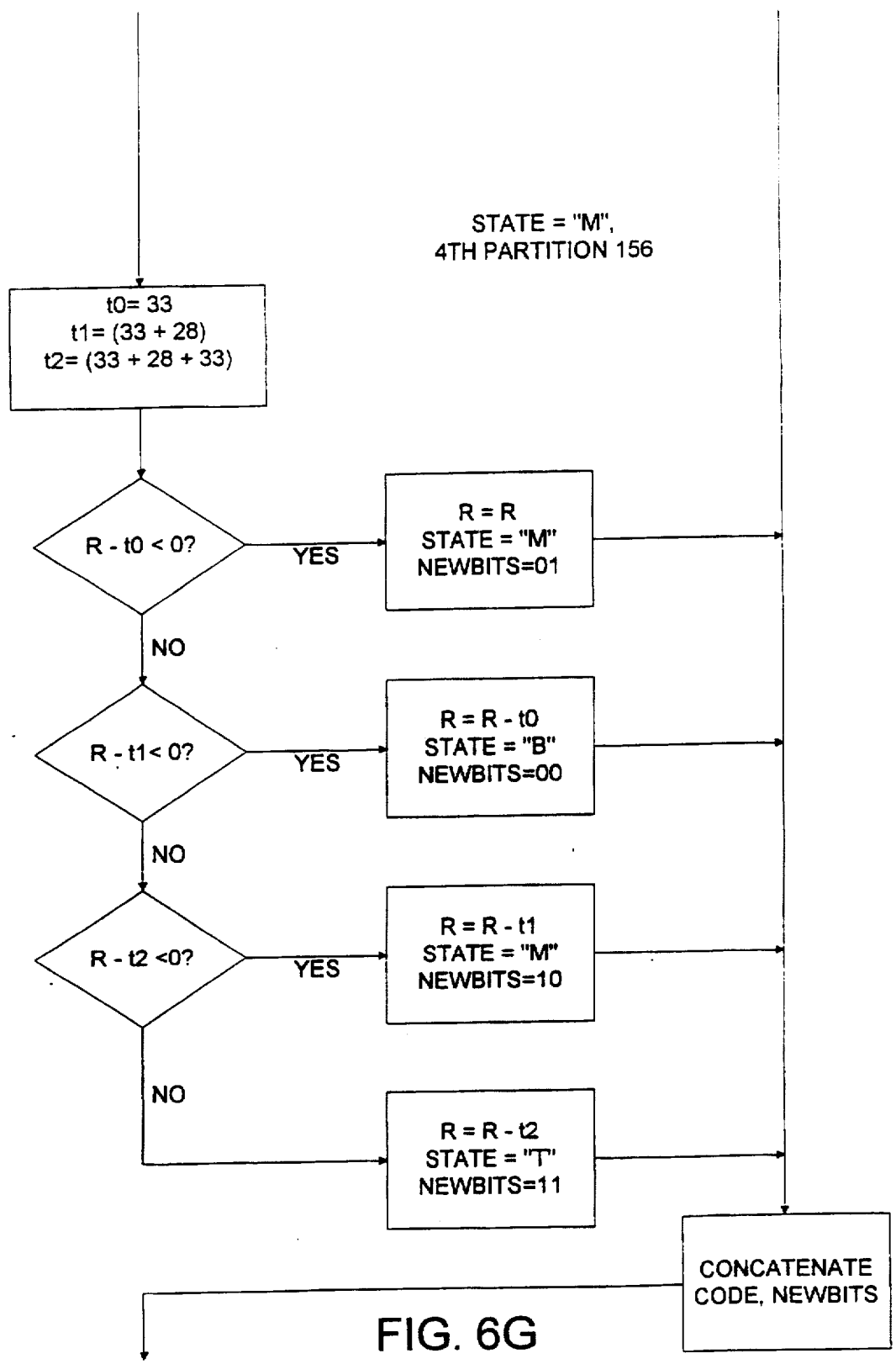
FIG. 6G is a flow chart for a fourth recursive partition of the second embodiment of the present invention for a trellis state "M".

FIGS. 6F and 6G are flow charts for fourth partition 156 with FIG. 6F showing the partition encoding for an encoder that enters the fourth partition with STATE equal to "T" or "B" and FIG. 6G shows the partition encoding for an encoder that enters the fourth partition with STATE equal to "M".

If STATE is "T" at the beginning of fourth partition 156, threshold values t0 and t1 are set to 17 and (17+17), respectively. The value stored in R is sequentially compared against threshold values t0 and t1 in decision boxes 193 and 194, respectively. If the value of R is less than t0 (17), the encoder's STATE remains at "T" and "01" is stored in NEWBITS. If the value of R is greater than or equal to t0, but less than t1 (17+17), STATE remains at "T", "10" is stored in NEWBITS, and the value of R is modified to R-t0 (17). For values of R that are greater than t1, the encoder changes STATE to "M", "00" is stored in NEWBITS, and the value of R is modified to R-t1.

If the encoder enters the fourth partition 156 with STATE equal to "B", threshold values t0 and t1 are set to 33 and (33+28), respectively. For values of R at the beginning of fourth partition 156 that are less than t0 (33) the encoder changes STATE to "M" and NEWBITS is set to "11". If the value of R is greater than or equal to t0, but less than t1 (33+28), STATE remains at "B", NEWBITS is set to "01", and the value in R is set to R-t0. For values of R that are greater than t1, the encoder remains in STATE "B", NEWBITS is set to "10", and the value of R is set to R-t1.

When the encoder enters fourth partition 156 with STATE equal to "M", threshold values t0, t1 and t2 are set to 33, (33+28) and (33+28+33), respectively. Values of R that are less than t0 (33) cause the encoder's STATE to remain at "M", and the binary value "01" to be stored in NEWBITS. For values of R greater than or equal to t0, but less than t1 (33+28), STATE changes to "B", NEWBITS is set to "00", and the value of R is modified to the value of R-t0. If the value of R is greater than or equal to t1, but less than t2 (33+28+33), the encoder's STATE remains at "M", NEWBITS is set to "10", and the value of R is modified to the value of R-t1. If the value of R is greater than t2, the encoder's STATE changes to "T", "11" is placed in NEWBITS, and the value of R is modified to the value of R-t2.

At the end of the fourth partition, the two bit value in NEWBITS is concatenated to the end of the 6-bit value in CODE. The new 8-bit concatenation is then stored in CODE.

Figure 6H:
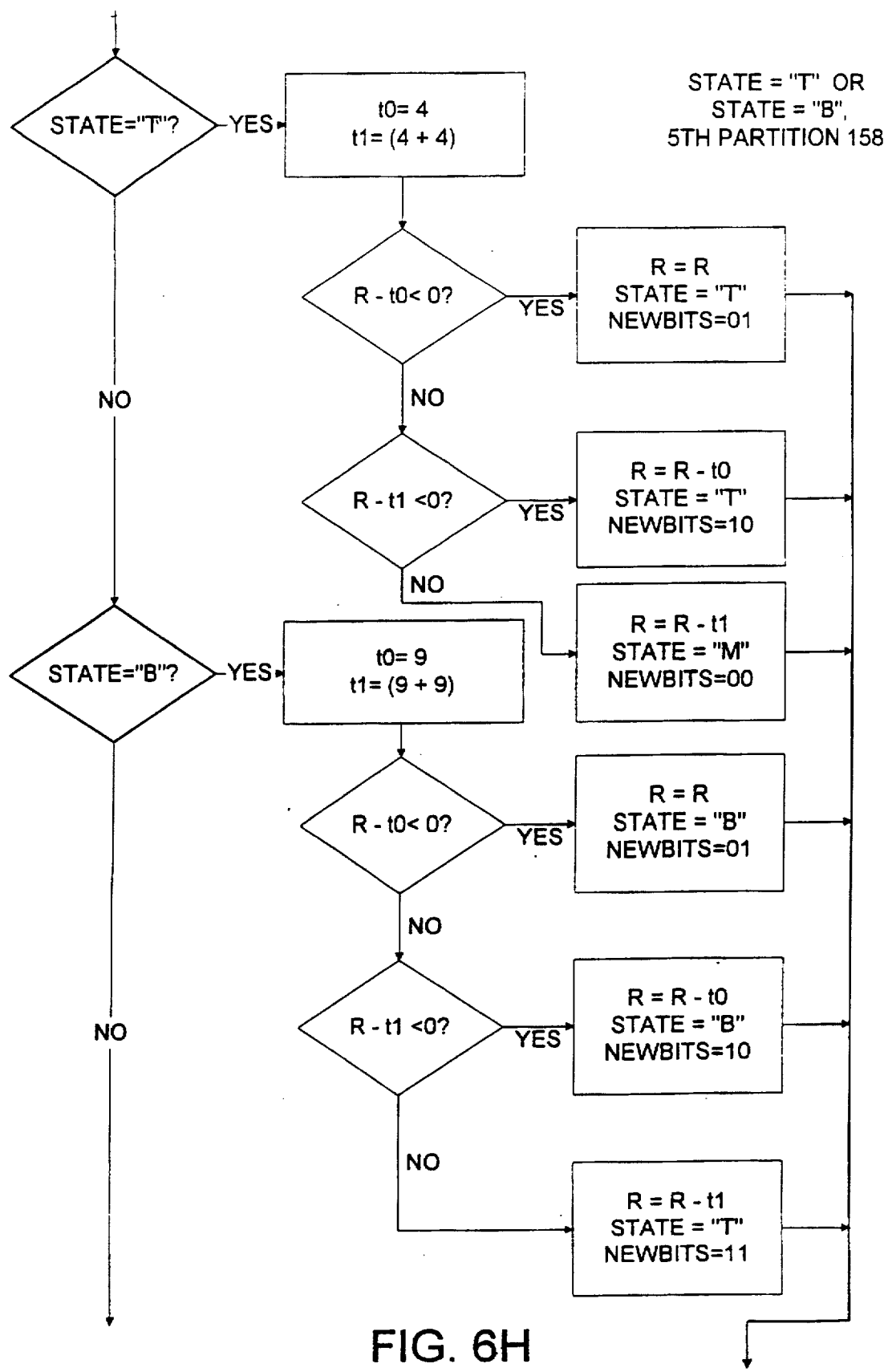
FIG. 6H is a flow chart of the fifth recursive partition of the second embodiment of the present invention for a trellis state "T" or "B".
Figure 61:
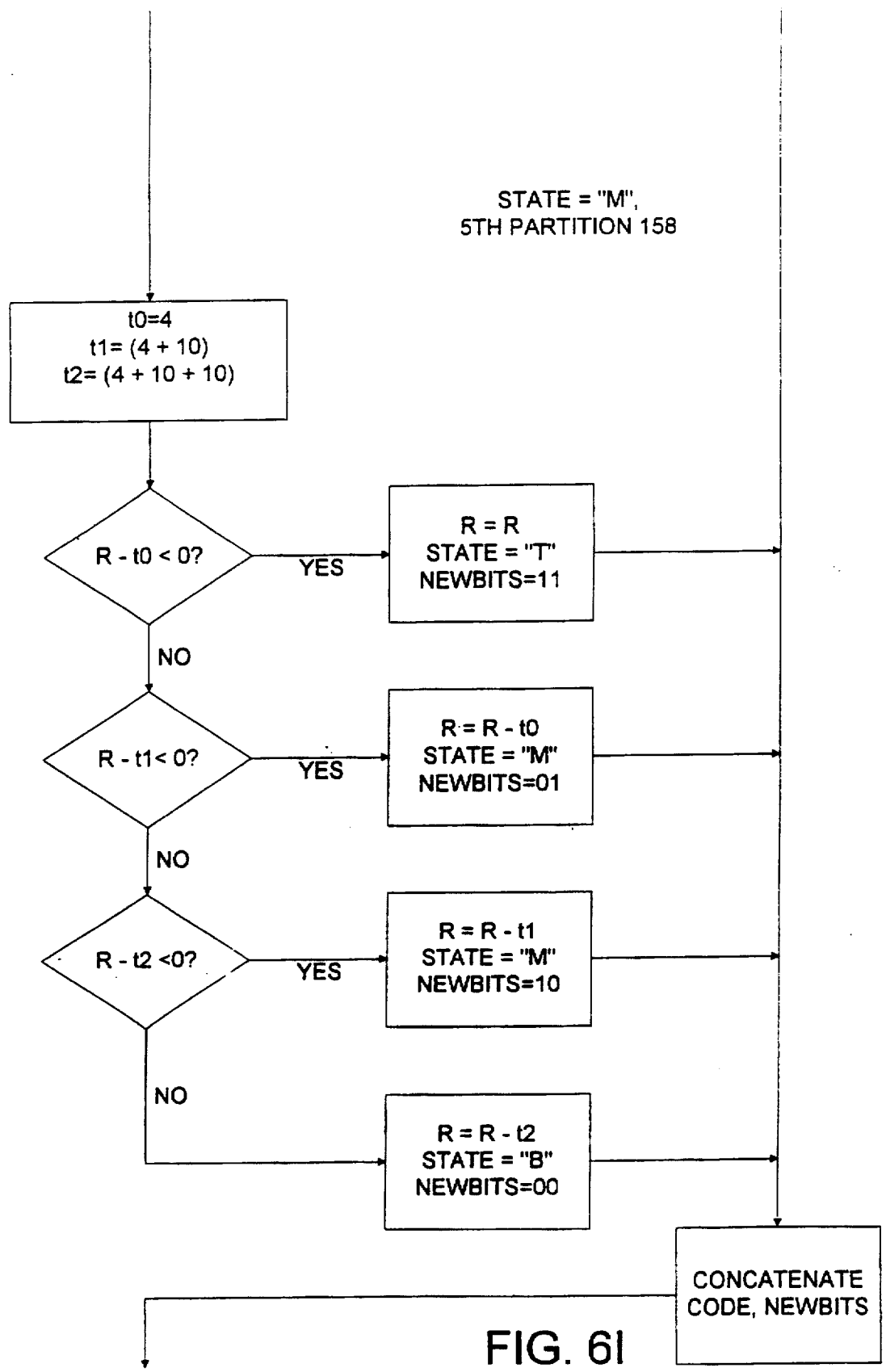

In fifth partition 158, as shown in FIGS. 6H and 6I, another 2-bit portion is concatenated to the end of CODE depending on the state in which the encoder enters fifth partition 158 and the current value of R. If the encoder enters fifth partition 158 with STATE equal to "T" R is compared against t0 and t1 which are set to 4 and (4+4), respectively. If R is less than t0, the encoder s STATE remains at "T" and "01" is stored in NEWBITS. If the value of R is greater than or equal to t0, but less than t1(4+4), the encoder's STATE also remains at "T", but NEWBITS is set to "10", and the value of R is modified to the value of R-t0. For values of R greater than t1(4+4), the encoder's STATE changes to "M", NEWBITS receives "00" and the value of R changes to the value of R-t1.

When the encoder enters fifth partition 158 and STATE equals "B", threshold values t0 and t1 are set to 9, (9+9), respectively. For values of R less than t0, STATE remains at "B" and NEWBITS receives "01". If the value of R is greater than or equal to t0, but less than t1 (9+9), STATE also remains at "B", but NEWBITS is set to "10" and R is set to R-t0. For values of R greater than t1, the encoder changes STATE to "T", NEWBITS is set to "11", and R is set to R-t1.

FIG. 6I is a flow diagram for an encoder that enters fifth partition 158 with STATE equal to "M". In this state, to is set to 4, t1 is set to (4+10) and t2 is set to (4+10+10). If the value of R is less than to at the beginning of fifth partition 158, STATE is set to "T", NEWBITS is set to "11", and R remains unchanged. If R is greater than or equal to t0, but less than t1 (4+10), the encoder's STATE remains at "M", NEWBITS receives "01", and the value of R is changed to the value of R-t0. For values of R greater than or equal to t1, but less than t2 (4+10+10), the encoder STATE remains at "M", but NEWBITS is set to "10" and the value of R is set to R-t1. If the value of R is greater than t2 at the beginning of fifth partition 158, the encoder's STATE changes to "B", NEWBITS is set to "00", and the value of R is set to the value of R-t2.

At the end of the fifth partition, the 8-bit value stored in CODE is concatenated with the two bit value stored in NEWBITS. This forms the first ten bits of the most significant bits of the eventual code word.

Figure 6J:
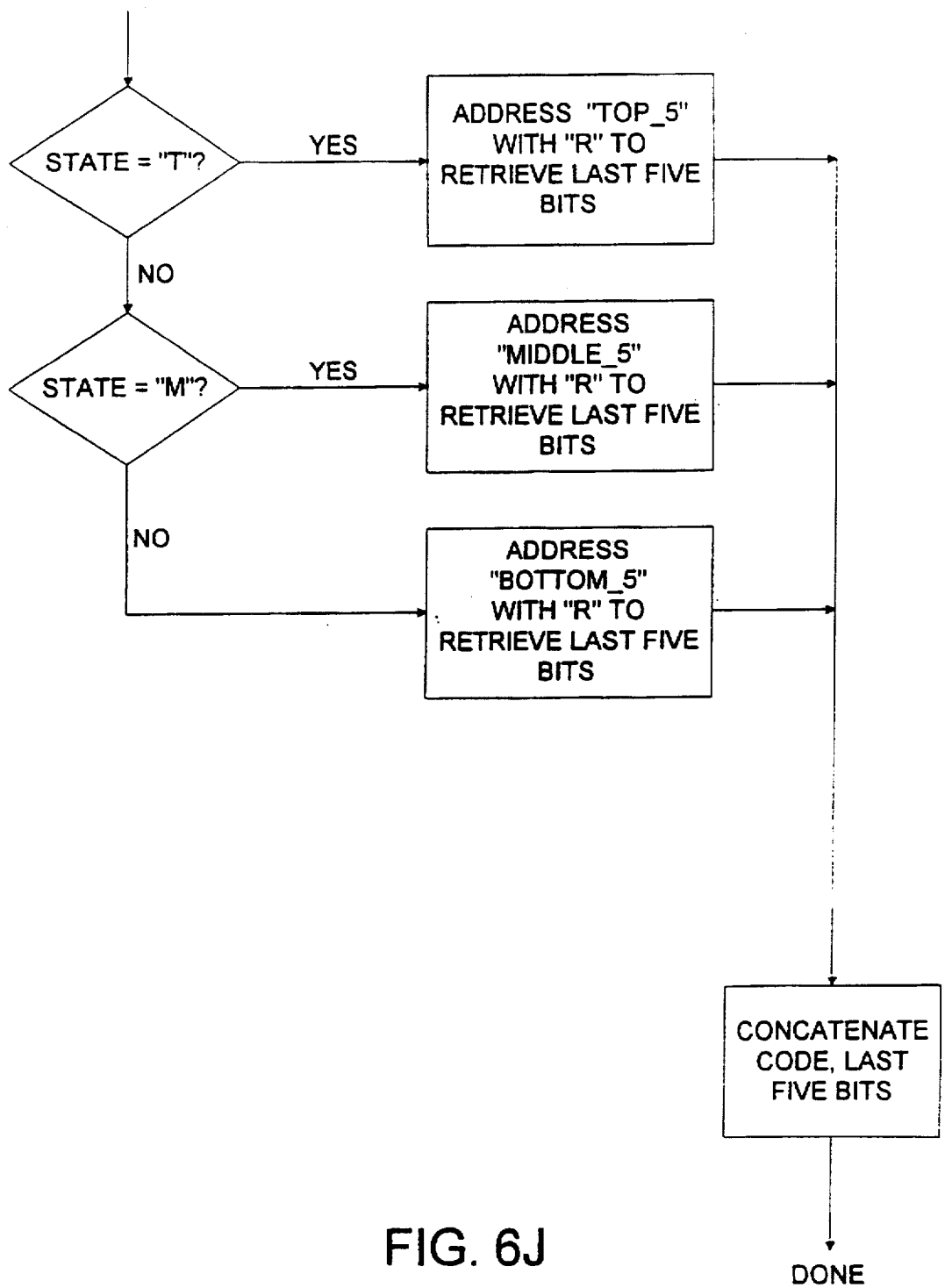
FIG. 6J is a flow chart for the table look-up of the second embodiment of the present invention.

FIG. 6J is a flow diagram of the table look-up of the sixth partition of the second embodiment of the present invention. In the table look-up portion, the method addresses one of three tables with the value in R. The table that is addressed is selected based on the value of STATE at the beginning of sixth partition 160. If the encoder enters sixth partition 160 with STATE equal to "T", the method addresses table TOP_5 which has four 5-bit entries as shown in Appendix A. If the encoder enters sixth partition 160 with STATE equal to "M", table MIDDLE_5 is addressed using the value of R to select one of ten 5-bit entries. When the encoder enters sixth partition 160 with STATE equal to "B", table BOTTOM_5 is addressed with the value of R to retrieve one of nine 5-bit values. After a 5-bit value has been retrieved from one of the three tables shown in Appendix A, the 5-bit value is concatenated to the end of the 10-bit value stored in CODE to form the codeword.

The 5-bit value stored in tables MIDDLE_5 and BOTTOM_5 are ordered to give preference to values which eliminate invalid codewords. Specifically, table MIDDLE_FIVE gives preference to 5-bit values that begin with 1 by placing these values at the beginning of the list and associating them with low values. Similarly, table BOTTOM_5 orders its list so that 5-bit values beginning with 1 occur at the beginning of the list. This ordering, in combination with restricting access to the beginning of a pathway that would generate invalid codewords, eliminates codewords that would violate the six consecutive same symbol constraint.

In addition, tables TOP_5, MIDDLE_5, and BOTTOM_5 are preferably implemented by directly synthesizing them in simple logic. In this implementation, the value of R is applied directly to the simple logic to create the 5-bit code portion.

Figure 7:
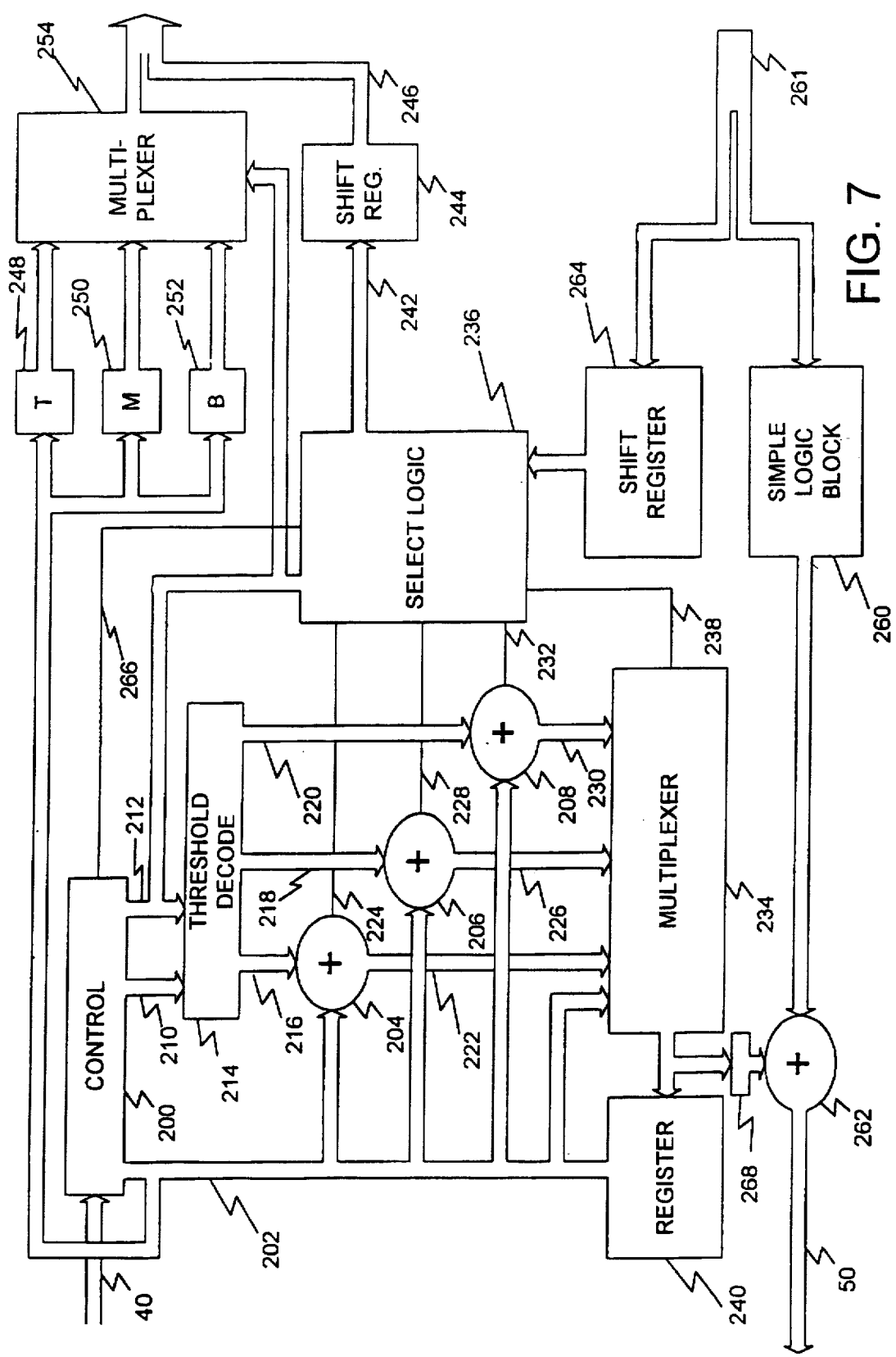
FIG. 7 is a block diagram of an encoder/decoder used in the second embodiment of the present invention.

FIG. 7 is a block diagram of an encoder/decoder for use in the second embodiment of the present invention. During encoding, control unit 200 receives INPUT VALUES 40 on a 12-bit input line. At the beginning of encoding, control 200 reflects INPUT VALUE 40 on remainder 202, which is also a 12-bit line. Remainder 202 is input to first threshold adder 204, second threshold adder 206, and third threshold adder 208. Control 200 also places values on partition bus 210 and state bus 212, which are input to threshold decode 214. On partition bus 210, control 200 places the current partition of the encoder and on state bus 212, control 200 places the current state, T, M, or B, of the encoder.

Threshold decode 214 uses the values on partition bus 210 and state bus 212 to generate three threshold values t0 216, t1 218 and t2 220, which are received by first threshold adder 204, second threshold adder 206, and third threshold adder 208, respectively. The values on t0 216, t1 218, and t2 220 correspond to the threshold values of t0, t1, and t2 described in reference to the flow chart of FIGS. 6A through 6J, with the threshold values changing depending on the partition and the state of the encoder. During encoding, t0 216, t1 218, and t2 220 each contain the two's complement form of the threshold values described in FIGS. 6A through 6J.

First threshold adder 204 adds the value on t0 216 to the value on remainder 202, producing a first remainder 222 and a first carry 224. During encoding, first reminder 222 contains the difference between remainder 202 and t0, the threshold that was complimented to form t0 216. Carry 224 indicates whether the addition performed by first adder 204 resulted in a negative number, with a "0" on carry 224 indicating that the value on remainder 202 is less than threshold t0, and a "1" on carry 224 indicating that the remainder was greater than or equal to t0.

Threshold adder 206 produces second remainder 226 and second carry 228 in response to an addition performed between remainder 202 and t1 218. During encoding, second remainder 226 contains the difference between remainder 202 and the threshold value, t1 that is complimented to form t1 218. Second carry 228 has a value of "1" if remainder 202 is greater than or equal to t1.

Third threshold adder 208 sums together the value on remainder 202 and t2 220 to produce third reminder 230 and third carry 232. During encoding, third remainder 230 contains the difference between remainder 202 and t2, the threshold value that is complimented to form t2 220. Third carry 232 indicates that reminder 202 is greater than or equal to t2, if third carry 232 contains a 1.

Remainder 202, first remainder 222, second remainder 226, and third remainder 230 are input to multiplexer 234, which receives a select signal 238 from select logic 236. Select logic 236 produces select signal 238 in response to the values of first carry 224, second carry 228, and third carry 232. As shown in FIGS. 6A through 6J, select logic 236 causes multiplexer 234 to select remainder 202 if the value on remainder 202 is less than the absolute value of t0, which is indicated by a 0 on first carry 224. Select logic 236 causes multiplexer 234 to select first reminder 222 if the value on remainder 202 is greater than or equal to t0, but less than t1, indicated by a 1 on first carry 224 and a 0 on second carry 228. Third remainder 230 is selected if remainder 202 is greater than or equal to t1, but less than t2, which is indicated by a 1 on first carry 224 and second carry 228 and a 0 on third carry 232. Lastly, third remainder 230 is selected by multiplexer 234 if remainder 202 is greater than or equal to t2, which is indicated by a 1 on third carry 232.

Multiplexer 234 outputs the selected remainder to 12-bit register 240. Register 240 loads the remainder to its output, which is tied to remainder 202.

Select logic 236, in addition to producing select 238, also produces NEWBITS 242. Select logic 236 produces NEWBITS 242 in response to the values on first carry 224, second carry 228 and third carry 232, as well as the state of the encoder which select logic 236 receives from its connection to state bus 212. Using the logic described in the flow chart of FIGS. 6A through 6J, select logic 236 produces two bits on NEWBITS 242 for each of the first five partitions. NEWBITS 242 are output to shift register 244 which has a 10-bit output 246. With each partition, the existing values in shift register 244 are shifted two positions and the 2-bit value on NEWBITS 242 is inserted into the vacated positions. After five partitions, shift register 244 contains a 10-bit value.

The four least significant bits of remainder 202 are input to simple logic blocks 248, 250 and 252 which directly implement the outcome shown in tables TOP_5, MIDDLE_5, and BOTTOM_5, respectively, of Appendix A. Specifically, simple logic block 248 implements the outcomes of TOP_5 with logic operations instead of by addressing a memory location and retrieving a value from memory. Similarly, simple logic blocks 250 and 252 implement the outcomes of tables MIDDLE_5 and BOTTOM_5. Each simple logic block has a 5-bit output which is input to multiplexer 254.

Multiplexer 254 has its select input tied to state bus 212 and selects one of the three simple logic block outputs to pass to its output depending on the value on state bus 212. Specifically, when state bus 212 indicates that the encoder ended the fifth partition in state "T", multiplexer 254 selects the 5-bit output from simple logic 248 associated with table TOP_5. When the encoder is in state "M" at the end of the fifth partition, multiplexer 254 selects the five-bit output from simple logic block 250 associated with table MIDDLE_5. And when the encoder ends the fifth partition in state "B", multiplexer 254 passes the 5-bit output of simple logic block 252 associated with table BOTTOM_5.

The five bit output of multiplexer 254 is combined with the 10-bit output 246 to form a 15-bit codeword which is eventually output to the channel.

Many of the encoding components shown in FIG. 7 may be used to decode codewords. To perform a decoding function, the 15-bit codeword is divided, separating the five least significant bits from the remaining 10-bits. The five least significant bits are input to simple logic block 260, which uses simple logic gates to directly implement table DECODE of Appendix A. Simple logic block 260 only outputs decoded values that are greater than or equal to 0, with values less than zero indicated in table DECODE by a 1 in the most significant position. The four least significant bits of a signed value of table DECODE is output from simple logic block 260 and is input to decoder adder 262.

During decoding, the ten most significant bits in the codeword are input to shift register 264. Shift register 264 outputs two consecutive bits in the 10-bit portion during each of a set of clock periods beginning with the most significant two bits and ending with the least significant two bits of the 10-bit portion.

At the beginning of decoding, control 200 places a value of 0 on remainder 202, sets partition bus 210 to indicate that the decoder is in the first partition and sets state bus 212 to state "M". This causes threshold decode 214 to output the same threshold values it does for the first partition during encoding. Thus, t0 216, t1 218, and t2 220 are the 2's compliments of 614, (614+1275) and (614+1275+1275), respectively, in the first partition of decoding. These values are summed with the value of 0 on remainder 202 by first threshold adder 204, second threshold adder 206 and third threshold adder 208, respectively, and their output, first remainder 222, second remainder 226, and third remainder 230 are input to multiplexer 234.

Depending on the 2-bit value received by select logic 236 from shift register 264, select 238 causes multiplexer 234 to select one of the resulting sums to pass to register 240. Register 240 then places this value at its output creating a new remainder 202, which may then be added to threshold values associated with other partitions. This process continues through five cycles until all 10-bits in shift register 264 have been used to perform the inverse mapping of the encoder. At the end of five cycles, the output of multiplexer 234, corresponding to a sum of the thresholds through five partitions, is input to compliment logic 268 which converts the 2's compliment sum to a positive recursive sum.

Decoder adder 262 adds the recursive sum from compliment logic 268 with the value from simple logic block 260 to create OUTPUT VALUES 50.

Those skilled in the art will recognize that the recursive nature of the second embodiment of the present invention helps reduce the number of components needed to implement the coding method described in FIGS. 6A through 6J.

Although the present invention has been described with reference to preferred embodiments, workers skilled in the art will recognize that changes may be made in form and detail without departing from the spirit and scope of the invention.

-34-

APPENDIX A

START_TOP

| ADDRESS | START | ADDRESS | START |
|---|---|---|---|
| 000000 | 00101111 | 001000 | 01011101 |
| 000001 | 00110111 | 001001 | 01011110 |
| 000010 | 00111011 | 001010 | 01100111 |
| 000011 | 00111101 | 001011 | 01101011 |
| 000100 | 00111110 | 001100 | 01101101 |
| 000101 | 01001111 | 001101 | 01101110 |
| 000110 | 01010111 | 001110 | 01110011 |
| 000111 | 01011011 | 001111 | 01110101 |

| ADDRESS | START | ADDRESS | START |
|---|---|---|---|
| 010000 | 01110110 | 011000 | 10100111 |
| 010001 | 01111001 | 011001 | 10101011 |
| 010010 | 01111010 | 011010 | 10101101 |
| 010011 | 10001111 | 011011 | 10101110 |
| 010100 | 10010111 | 011100 | 10110011 |
| 010101 | 10011011 | 011101 | 10110101 |
| 010110 | 10011101 | 011110 | 10110110 |
| 010111 | 10011110 | 011111 | 10111001 |

| ADDRESS | START | ADDRESS | START |
|---|---|---|---|
| 100000 | 10111010 | 101000 | 11011001 |
| 100001 | 11000111 | 101001 | 11011010 |
| 100010 | 11001011 | | |
| 100011 | 11001101 | | |
| 100100 | 11001110 | | |
| 100101 | 11010011 | | |
| 100110 | 11010101 | | |
| 100111 | 11010110 | | |

-35-

TOP_END

| ADDRESS | END | ADDRESS | END |
|---|---|---|---|
| 0000 | 1001000 | 1000 | 0011000 |
| 0001 | 1000100 | 1001 | 0010100 |
| 0010 | 1000010 | 1010 | 0010010 |
| 0011 | 1000001 | 1011 | 0010001 |
| 0100 | 0101000 | 1100 | 0001100 |
| 0101 | 0100100 | 1101 | 0001010 |
| 0110 | 0100010 | 1110 | 0001001 |
| 0111 | 0100001 | 1111 | 0000110 |

START_BOTTOM

| ADDRESS | START | ADDRESS | START |
|---|---|---|---|
| 000000 | 00010101 | 001000 | 00101010 |
| 000001 | 00010110 | 001001 | 00101100 |
| 000010 | 00011001 | 001010 | 00110001 |
| 000011 | 00011010 | 001011 | 00110010 |
| 000100 | 00011100 | 001100 | 00110100 |
| 000101 | 00100101 | 001101 | 00111000 |
| 000110 | 00100110 | 001110 | 01000101 |
| 000111 | 00101001 | 001111 | 01000110 |

| ADDRESS | START | ADDRESS | START |
|---|---|---|---|
| 010000 | 01001001 | 011000 | 01100010 |
| 010001 | 01001010 | 011001 | 01100100 |
| 010010 | 01001100 | 011010 | 01101000 |
| 010011 | 01010001 | 011011 | 01110000 |
| 010100 | 01010010 | 011100 | 10000101 |
| 010101 | 01010100 | 011101 | 10000110 |
| 010110 | 01011000 | 011110 | 10001001 |
| 010111 | 01100001 | 011111 | 10001010 |

| ADDRESS | START | ADDRESS | START |
|---|---|---|---|
| 100000 | 10001100 | 101000 | 10101000 |
| 100001 | 10010001 | 101001 | 10110000 |
| 100010 | 10010010 | 101010 | 11000001 |
| 100011 | 10010100 | 101011 | 11000010 |
| 100100 | 10011000 | 101100 | 11000100 |
| 100101 | 10100001 | 101101 | 11001000 |
| 100110 | 10100010 | 101110 | 11010000 |
| 100111 | 10100100 | | |

-36-

BOTTOM_END_16

|    | ADDRESS | END     | ADDRESS | END     |
|----|---------|---------|---------|---------|
|    | 0000    | 0101011 | 1000    | 0111100 |
| 5  | 0001    | 0101101 | 1001    | 1001011 |
|    | 0010    | 0101110 | 1010    | 1001101 |
|    | 0011    | 0110011 | 1011    | 1001110 |
|    | 0100    | 0110101 | 1100    | 1010011 |
|    | 0101    | 0110110 | 1101    | 1010101 |
| 10 | 0110    | 0111001 | 1110    | 1010110 |
|    | 0111    | 0111010 | 1111    | 1011001 |

BOTTOM_END_8

|    | ADDRESS | END     |
|----|---------|---------|
| 15 | 000     | 1011010 |
|    | 001     | 1011100 |
|    | 010     | 1100011 |
|    | 011     | 1100101 |
| 20 | 100     | 1100110 |
|    | 101     | 1101001 |
|    | 110     | 1101010 |
|    | 111     | 1101100 |

25 BOTTOM_END_4

|    | ADDRESS | END     |
|----|---------|---------|
|    | 00      | 1110001 |
|    | 01      | 1110010 |
| 30 | 10      | 1110100 |
|    | 11      | 1111000 |

FULL_CENTER

| ADDRESS | CODEWORD | ADDRESS | CODEWORD |
|---|---|---|---|
| 000000 | 011110001101000 | 001000 | 001100111101000 |
| 000001 | 101110001101000 | 001001 | 001101011101000 |
| 000010 | 110110001101000 | 001010 | 001101101101000 |
| 000011 | 000111101101000 | 001011 | 001110011101000 |
| 000100 | 001001111101000 | 001100 | 001110101101000 |
| 000101 | 001010111101000 | 001101 | 001111001101000 |
| 000110 | 001011011101000 | 001110 | 010001111101000 |
| 000111 | 001011101101000 | 001111 | 010010111101000 |

| ADDRESS | CODEWORD | ADDRESS | CODEWORD |
|---|---|---|---|
| 010000 | 010011011101000 | 011000 | 011000111101000 |
| 010001 | 010011101101000 | 011001 | 011001011101000 |
| 010010 | 010100111101000 | 011010 | 011001101101000 |
| 010011 | 010101011101000 | 011011 | 011010011101000 |
| 010100 | 010101101101000 | 011100 | 011010101101000 |
| 010101 | 010110011101000 | 011101 | 011011001101000 |
| 010110 | 010110101101000 | 011110 | 011100011101000 |
| 010111 | 010111001101000 | 011111 | 011100101101000 |

| ADDRESS | CODEWORD | ADDRESS | CODEWORD |
|---|---|---|---|
| 100000 | 011101001101000 | 101000 | 100101101101000 |
| 100001 | 000101111101000 | 101001 | 100110011101000 |
| 100010 | 100001111101000 | 101010 | 100110101101000 |
| 100011 | 100010111101000 | 101011 | 100111001101000 |
| 100100 | 100011011101000 | 101100 | 101000111101000 |
| 100101 | 100011101101000 | 101101 | 101001011101000 |
| 100110 | 100100111101000 | 101110 | 101001101101000 |
| 100111 | 100101011101000 | 101111 | 101010011101000 |

| ADDRESS | CODEWORD | ADDRESS | CODEWORD |
|---|---|---|---|
| 110000 | 101010101101000 | 111000 | 110001011101000 |
| 110001 | 101011001101000 | 111001 | 110010011101000 |
| 110010 | 101100011101000 | 111010 | 110010101101000 |
| 110011 | 101100101101000 | 111011 | 110011001101000 |
| 110100 | 101101001101000 | | |
| 110101 | 000110111101000 | | |
| 110110 | 110000111101000 | | |
| 110111 | 110001101101000 | | |

-38-

START_CNTR

| ADDRESS | START    | ADDRESS | START    |
|---------|----------|---------|----------|
| 000000  | 01111000 | 001000  | 00110011 |
| 000001  | 10111000 | 001001  | 00110101 |
| 000010  | 11011000 | 001010  | 00110110 |
| 000011  | 00011110 | 001011  | 00111001 |
| 000100  | 00100111 | 001100  | 00111010 |
| 000101  | 00101011 | 001101  | 00111100 |
| 000110  | 00101101 | 001110  | 01000111 |
| 000111  | 00101110 | 001111  | 01001011 |

| ADDRESS | START    | ADDRESS | START    |
|---------|----------|---------|----------|
| 010000  | 01001101 | 011000  | 01100011 |
| 010001  | 01001110 | 011001  | 01100101 |
| 010010  | 01010011 | 011010  | 01100110 |
| 010011  | 01010101 | 011011  | 01101001 |
| 010100  | 01010110 | 011100  | 01101010 |
| 010101  | 01011001 | 011101  | 01101100 |
| 010110  | 01011010 | 011110  | 01110001 |
| 010111  | 01011100 | 011111  | 01110010 |

| ADDRESS | START    | ADDRESS | START    |
|---------|----------|---------|----------|
| 100000  | 01110100 | 101000  | 10010110 |
| 100001  | 00010111 | 101001  | 10011001 |
| 100010  | 10000111 | 101010  | 10011010 |
| 100011  | 10001011 | 101011  | 10011100 |
| 100100  | 10001101 | 101100  | 10100011 |
| 100101  | 10001110 | 101101  | 10100101 |
| 100110  | 10010011 | 101110  | 10100110 |
| 100111  | 10010101 | 101111  | 10101001 |

| ADDRESS | START    | ADDRESS | START    |
|---------|----------|---------|----------|
| 110000  | 10101010 | 111000  | 11000110 |
| 110001  | 10101100 | 111001  | 11001001 |
| 110010  | 10110001 | 111010  | 11001010 |
| 110011  | 10110010 | 111011  | 11001100 |
| 110100  | 10110100 | 111100  | 11010001 |
| 110101  | 00011011 | 111101  | 11010010 |
| 110110  | 11000011 | 111110  | 11010100 |
| 110111  | 11000101 | 111111  | 00011101 |

CNTR_END

| ADDRESS | END | ADDRESS | END |
|---------|---------|---------|---------|
| 00000 | 0001011 | 01000 | 0011100 |
| 00001 | 0001101 | 01001 | 0100011 |
| 00010 | 0001110 | 01010 | 0100101 |
| 00011 | 0010011 | 01011 | 0100110 |
| 00100 | 0010101 | 01100 | 0101001 |
| 00101 | 0010110 | 01101 | 0101010 |
| 00110 | 0011001 | 01110 | 0101100 |
| 00111 | 0011010 | 01111 | 0110001 |

| ADDRESS | END | ADDRESS | END |
|---------|---------|---------|---------|
| 10000 | 0110010 | 11000 | 1001100 |
| 10001 | 0110100 | 11001 | 1010001 |
| 10010 | 0111000 | 11010 | 1010010 |
| 10011 | 1000011 | 11011 | 1010100 |
| 10100 | 1000101 | 11100 | 1011000 |
| 10101 | 1000110 | 11101 | 1100001 |
| 10110 | 1001001 | 11110 | 1100010 |
| 10111 | 1001010 | 11111 | 1100100 |

REPLACE

| ADDRESS | CODEWORD | ADDRESS | CODEWORD |
|---------|---------|---------|---------|
| 0000 | 110100011101000 | 1010 | 000111110010010 |
| 0001 | 110100101101000 | | |
| 0010 | 110101001101000 | | |
| 0100 | 000111110101000 | | |
| 0101 | 000111110100100 | | |
| 0110 | 000111110100010 | | |
| 1000 | 000111110011000 | | |
| 1001 | 000111110010100 | | |

DEC_TOP_START

| ADDRESS | IN_TOP_START | TOP_REPLACEMENT | INDEX_START_TOP |
|---------|---------|---------|---------|
| 00101111 | 1 | 0 | 000000 |
| 00110111 | 1 | 0 | 000001 |
| 00111011 | 1 | 0 | 000010 |
| 00111101 | 1 | 0 | 000011 |
| 00111110 | 1 | 0 | 000100 |

-40-

| ADDRESS | IN_TOP_START | TOP_REPLACEMENT | INDEX_START_TOP |
|---|---|---|---|
| 01001111 | 1 | 0 | 000101 |
| 01010111 | 1 | 0 | 000110 |
| 01011011 | 1 | 0 | 000111 |
| 01011101 | 1 | 0 | 001000 |
| 01011110 | 1 | 0 | 001001 |
| 01100111 | 1 | 0 | 001010 |
| 01101011 | 1 | 0 | 001011 |
| 01101101 | 1 | 0 | 001100 |
| 01101110 | 1 | 0 | 001101 |
| 01110011 | 1 | 0 | 001110 |
| 01110101 | 1 | 0 | 001111 |
| 01110110 | 1 | 0 | 010000 |
| 01111001 | 1 | 0 | 010001 |
| 01111010 | 1 | 0 | 010010 |
| 10001111 | 1 | 0 | 010011 |
| 10010111 | 1 | 0 | 010100 |
| 10011011 | 1 | 0 | 010101 |
| 10011110 | 1 | 0 | 010110 |
| 10100111 | 1 | 0 | 010111 |
| 10101011 | 1 | 0 | 011000 |
| 10101101 | 1 | 0 | 011001 |
| 10101110 | 1 | 0 | 011010 |
| 10110011 | 1 | 0 | 011011 |
| 10110101 | 1 | 0 | 011100 |
| 10110110 | 1 | 0 | 011101 |
| 10111001 | 1 | 0 | 011110 |
| 10111010 | 1 | 0 | 011111 |
| 11000111 | 1 | 0 | 100000 |
| 11001011 | 1 | 0 | 100001 |
| 11001101 | 1 | 0 | 100010 |
| 11001110 | 1 | 0 | 100011 |
| 11010011 | 1 | 0 | 100100 |
| 11010101 | 1 | 0 | 100101 |
| 11010110 | 1 | 0 | 100110 |
| 11011001 | 1 | 0 | 100111 |
| 11011010 | 1 | 0 | 101000 |
| 00011111 | 1 | 1 | 101001 |
| DEFAULT | 0 | 0 | 000000 |

-41-

DEC_TOP_END

| ADDRESS | IN_TOP_END | 6TH_BIT_REPL | INDEX_END_TOP |
|---|---|---|---|
| 1001000 | 1 | 0 | 000000 |
| 1000100 | 1 | 0 | 000001 |
| 1000010 | 1 | 0 | 000010 |
| 1000001 | 1 | 0 | 000011 |
| 0101000 | 1 | 0 | 000100 |
| 0100100 | 1 | 0 | 000101 |
| 0100010 | 1 | 0 | 000110 |
| 0100001 | 1 | 0 | 000111 |
| 0011000 | 1 | 1 | 001000 |
| 0010100 | 1 | 1 | 001001 |
| 0010010 | 1 | 1 | 001010 |
| 0010001 | 1 | 0 | 001011 |
| 0001100 | 1 | 0 | 001100 |
| 0001010 | 1 | 0 | 001101 |
| 0001001 | 1 | 0 | 001110 |
| 0000110 | 1 | 0 | 001111 |
| DEFAULT | 0 | 0 | 000000 |

DEC_MID_START

| ADDRESS | IN_MID_START | MID_REPLACEMENT | INDEX_START_MID |
|---|---|---|---|
| 01111000 | 1 | 0 | 000000 |
| 10111000 | 1 | 0 | 000001 |
| 11011000 | 1 | 0 | 000010 |
| 00011110 | 1 | 0 | 000011 |
| 00100111 | 1 | 0 | 000100 |
| 00101011 | 1 | 0 | 000101 |
| 00101101 | 1 | 0 | 000110 |
| 00101110 | 1 | 0 | 000111 |
| 00110011 | 1 | 0 | 001000 |
| 00110101 | 1 | 0 | 001001 |
| 00110110 | 1 | 0 | 001010 |
| 00110011 | 1 | 0 | 001011 |
| 00111010 | 1 | 0 | 001100 |
| 00111100 | 1 | 0 | 001101 |
| 01000111 | 1 | 0 | 001110 |
| 01001011 | 1 | 0 | 001111 |
| 01001101 | 1 | 0 | 010000 |
| 01001110 | 1 | 0 | 010001 |

-42-

| | ADDRESS | IN_MID_START | MID_REPLACEMENT | INDEX_START_MID |
|---|---|---|---|---|
| | 01010011 | 1 | 0 | 010010 |
| | 01010101 | 1 | 0 | 010011 |
| | 01010110 | 1 | 0 | 010100 |
| | 01011001 | 1 | 0 | 010101 |
| 5 | 01011010 | 1 | 0 | 010110 |
| | 01011100 | 1 | 0 | 010111 |
| | 01100011 | 1 | 0 | 011000 |
| | 01100101 | 1 | 0 | 011001 |
| | 01100110 | 1 | 0 | 011010 |
| 10 | 01101001 | 1 | 0 | 011011 |
| | 01101010 | 1 | 0 | 011100 |
| | 01101100 | 1 | 0 | 011101 |
| | 01110001 | 1 | 0 | 011110 |
| | 01110010 | 1 | 0 | 011111 |
| 15 | 01110100 | 1 | 0 | 100000 |
| | 00010111 | 1 | 0 | 100001 |
| | 10000111 | 1 | 0 | 100010 |
| | 10001011 | 1 | 0 | 100011 |
| | 10001101 | 1 | 0 | 100100 |
| 20 | 10001110 | 1 | 0 | 100101 |
| | 10010011 | 1 | 0 | 100110 |
| | 10010101 | 1 | 0 | 100111 |
| | 10010110 | 1 | 0 | 101000 |
| | 10011001 | 1 | 0 | 101001 |
| 25 | 10011010 | 1 | 0 | 101010 |
| | 10011100 | 1 | 0 | 101011 |
| | 10100011 | 1 | 0 | 101100 |
| | 10100101 | 1 | 0 | 101101 |
| | 10100110 | 1 | 0 | 101110 |
| 30 | 10101001 | 1 | 0 | 101111 |
| | 10101010 | 1 | 0 | 110000 |
| | 10101100 | 1 | 0 | 110001 |
| | 10110001 | 1 | 0 | 110010 |
| | 10110010 | 1 | 0 | 110011 |
| 35 | 10110100 | 1 | 0 | 110100 |
| | 00011011 | 1 | 0 | 110101 |
| | 11000011 | 1 | 0 | 110110 |
| | 11000101 | 1 | 0 | 110111 |
| | 11000110 | 1 | 0 | 111000 |
| 40 | 11001001 | 1 | 0 | 111001 |
| | 11001010 | 1 | 0 | 111010 |

-43-

|   | ADDRESS | IN_MID_START | MID_REPLACEMENT | INDEX_START_MID |
|---|---------|--------------|-----------------|-----------------|
|   | 11001100 | 1 | 0 | 111011 |
|   | 11010001 | 1 | 1 | 111100 |
|   | 11010010 | 1 | 1 | 111101 |
|   | 11010100 | 1 | 1 | 111110 |
| 5 | 00011101 | 1 | 0 | 111111 |
|   | DEFAULT | 0 | 0 | 000000 |

DEC_MID_END

|    | ADDRESS | IN_MID_END | NOT_MID_2ND | INDEX_END_MID |
|----|---------|------------|-------------|---------------|
|    | 0001011 | 1 | 0 | 000000 |
|    | 0001101 | 1 | 0 | 000001 |
|    | 0001110 | 1 | 0 | 000010 |
| 15 | 0010011 | 1 | 0 | 000011 |
|    | 0010101 | 1 | 0 | 000100 |
|    | 0010110 | 1 | 0 | 000101 |
|    | 0011001 | 1 | 0 | 000110 |
|    | 0011010 | 1 | 0 | 000111 |
| 20 | 0011100 | 1 | 0 | 001000 |
|    | 0100011 | 1 | 0 | 001001 |
|    | 0100101 | 1 | 0 | 001010 |
|    | 0100110 | 1 | 0 | 001011 |
|    | 0101001 | 1 | 0 | 001100 |
| 25 | 0101010 | 1 | 0 | 001101 |
|    | 0101100 | 1 | 0 | 001110 |
|    | 0110001 | 1 | 0 | 001111 |
|    | 0110010 | 1 | 0 | 010000 |
|    | 0110100 | 1 | 0 | 010001 |
| 30 | 0111000 | 1 | 0 | 010010 |
|    | 1000011 | 1 | 0 | 010011 |
|    | 1000101 | 1 | 0 | 010100 |
|    | 1000110 | 1 | 0 | 010101 |
|    | 1001001 | 1 | 0 | 010110 |
| 35 | 1001010 | 1 | 0 | 010111 |
|    | 1001100 | 1 | 0 | 011000 |
|    | 1010001 | 1 | 0 | 011001 |
|    | 1010010 | 1 | 0 | 011010 |
|    | 1010100 | 1 | 0 | 011011 |
| 40 | 1011000 | 1 | 0 | 011100 |
|    | 1100001 | 1 | 0 | 011101 |

-44-

| ADDRESS | IN_MID_END | NOT_MID_2ND | INDEX_END_MID |
|---|---|---|---|
| 1100010 | 1 | 0 | 011110 |
| 1100100 | 1 | 0 | 011111 |
| 1101000 | 1 | 1 | 000000 |
| DEFAULT | 0 | 0 | 000000 |

DEC_BOT_START

| ADDRESS | IN_BOT_START | INDEX_START_BOT |
|---|---|---|
| 00010101 | 1 | 000000 |
| 00010110 | 1 | 000001 |
| 00011001 | 1 | 000010 |
| 00011010 | 1 | 000011 |
| 00011100 | 1 | 000100 |
| 00100101 | 1 | 000101 |
| 00100110 | 1 | 000110 |
| 00101001 | 1 | 000111 |
| 00101010 | 1 | 001000 |
| 00101100 | 1 | 001001 |
| 00110001 | 1 | 001010 |
| 00110010 | 1 | 001011 |
| 00110100 | 1 | 001100 |
| 00111000 | 1 | 001101 |
| 01000101 | 1 | 001110 |
| 01000110 | 1 | 001111 |
| 01001001 | 1 | 010000 |
| 01001010 | 1 | 010001 |
| 01001100 | 1 | 010010 |
| 01010001 | 1 | 010011 |
| 01010010 | 1 | 010100 |
| 01010100 | 1 | 010101 |
| 01011000 | 1 | 010110 |
| 01100001 | 1 | 010111 |
| 01100010 | 1 | 011000 |
| 01100100 | 1 | 011001 |
| 01101000 | 1 | 011010 |
| 01110000 | 1 | 011011 |
| 10000101 | 1 | 011100 |

-45-

| ADDRESS | IN_BOT_START | INDEX_START_BOT |
|---|---|---|
| 10000110 | 1 | 011101 |
| 10001001 | 1 | 011110 |
| 10001010 | 1 | 011111 |
| 10001100 | 1 | 100000 |
| 10010001 | 1 | 100001 |
| 10010010 | 1 | 100010 |
| 10010100 | 1 | 100011 |
| 10011000 | 1 | 100100 |
| 10100001 | 1 | 100101 |
| 10100010 | 1 | 100110 |
| 10100100 | 1 | 100111 |
| 10101000 | 1 | 101000 |
| 10110000 | 1 | 101001 |
| 11000001 | 1 | 101010 |
| 11000010 | 1 | 101011 |
| 11000100 | 1 | 101100 |
| 11001000 | 1 | 101101 |
| 11010000 | 1 | 101110 |
| DEFAULT | 0 | 000000 |

DEC_BOT_END

| ADDRESS | IN_BOT_END | BOTTOM_1ST | BOTTOM_2ND | INDEX_END_MID |
|---|---|---|---|---|
| 0101011 | 1 | 1 | 0 | 000000 |
| 0101101 | 1 | 1 | 0 | 000001 |
| 0101110 | 1 | 1 | 0 | 000010 |
| 0110011 | 1 | 1 | 0 | 000011 |
| 0110101 | 1 | 1 | 0 | 000100 |
| 0110110 | 1 | 1 | 0 | 000101 |
| 0111001 | 1 | 1 | 0 | 000110 |
| 0111010 | 1 | 1 | 0 | 000111 |
| 0111100 | 1 | 1 | 0 | 001000 |
| 1001011 | 1 | 1 | 0 | 001001 |
| 1001101 | 1 | 1 | 0 | 001010 |
| 1001110 | 1 | 1 | 0 | 001011 |
| 1010011 | 1 | 1 | 0 | 001100 |
| 1010101 | 1 | 1 | 0 | 001101 |
| 1010110 | 1 | 1 | 0 | 001110 |
| 1011001 | 1 | 1 | 0 | 001111 |
| 1011010 | 1 | 0 | 1 | 000000 |
| 1011100 | 1 | 0 | 1 | 000001 |

-46-

| ADDRESS | IN_BOT_END | BOTTOM_1ST | BOTTOM_2ND | INDEX_END_MID |
|---------|------------|------------|------------|---------------|
| 1100011 | 1 | 0 | 1 | 000010 |
| 1100101 | 1 | 0 | 1 | 000011 |
| 1100110 | 1 | 0 | 1 | 000100 |
| 1101001 | 1 | 0 | 1 | 000101 |
| 1101010 | 1 | 0 | 1 | 000110 |
| 1101100 | 1 | 0 | 1 | 000111 |
| 1110001 | 1 | 0 | 0 | 000000 |
| 1110010 | 1 | 0 | 0 | 000001 |
| 1110100 | 1 | 0 | 0 | 000010 |
| 1111000 | 1 | 0 | 0 | 000011 |
| DEFAULT | 0 | 0 | 0 | 000000 |

TOP_5

| ADDRESS | LAST FIVE BITS |
|---------|----------------|
| 00 | 01000 |
| 01 | 00100 |
| 10 | 00010 |
| 11 | 00001 |

MIDDLE_5

| ADDRESS | LAST FIVE BITS |
|---------|----------------|
| 0000 | 11000 |
| 0001 | 10100 |
| 0010 | 10010 |
| 0011 | 10001 |
| 0100 | 01100 |
| 0101 | 01010 |
| 0110 | 01001 |
| 0111 | 00110 |
| 1000 | 00101 |
| 1001 | 00011 |

BOTTOM_5

| ADDRESS | LAST FIVE BITS |
|---------|----------------|
| 0000 | 11100 |
| 0001 | 11010 |
| 0010 | 11001 |
| 0011 | 10110 |
| 0100 | 10101 |
| 0101 | 10011 |
| 0110 | 01110 |
| 0111 | 01101 |
| 1000 | 01011 |

DECODE

| ADDRESS | SIGNED VALUE | ADDRESS | SIGNED VALUE |
|---------|--------------|---------|--------------|
| 00000 | 10001 | 10000 | 10001 |
| 00001 | 00011 | 10001 | 00011 |
| 00010 | 00010 | 10010 | 00010 |
| 00011 | 01001 | 10011 | 00101 |
| 00100 | 00001 | 10100 | 00001 |
| 00101 | 01000 | 10101 | 00100 |
| 00110 | 00111 | 10110 | 00011 |
| 00111 | 10001 | 10111 | 10001 |
| 01000 | 00000 | 11000 | 00000 |
| 01001 | 00110 | 11001 | 00010 |
| 01010 | 00101 | 11010 | 00001 |
| 01011 | 01000 | 11011 | 10001 |
| 01100 | 00100 | 11100 | 00000 |
| 01101 | 00111 | 11101 | 10001 |
| 01110 | 00110 | 11110 | 10001 |
| 01111 | 10001 | 11111 | 10001 |

I claim:

1. A method of encoding an input value as an encoded value, the method comprising:

accessing at least two preset values by applying at least two values derived from the input value to at least two accessing means, respectively, each accessed preset value from a respective set of preset values, each set of preset values representing portions of a trellis code, the trellis code defined by allowed states for a running-digital sum, which increases by one with each binary one in the encoded value and which decreases by one with each binary zero in the encoded value, the number of possible encoded values that the trellis code can create being more than the number of possible input values, at least one possible preset value excluded from a set of preset values because its concatenation with at least one preset value from at least one other respective set of preset values creates an encoded value that violates a coding constraint and concatenating the accessed preset values to form the encoded value, the method characterised by:

choosing the sets of preset values, from which the preset values are accessed, based on the entire input value.

2. The method of claim 1 wherein the number of preset values in at least one of the two sets of preset values is a power of two.

3. The method of claim 1 wherein the coding constraint requires that encoded values do not have six consecutive same binary values.

4. The method of claim 1 wherein a twelve-bit input value is encoded as a fifteen-bit encoded value and a preset value of seven bits is concatenated with a preset value of eight bits to produce the encoded value.

5. The method of claim 1 wherein the entire trellis code permits running digital sums from the sets of sums (3), (4,2), (5,3,1), (4,2,0), (5,3,1), (6,4,2,0), (5,3,1), (6,4,2,0), (5,3,1), (6,4,2,0), (5,3,1), (4,2,0), (5,3,1), (4,2,0), (3,1), and (2) at respective encoding bit times 0,1,2,3,4,5,6,7,8,9,10,11,12, 13,14, and 15.

6. A method of encoding an input value as an encoded value, the method comprising:

comparing the input value to a first set of threshold values;

determining a state, a remainder and at least two binary digits of the encoded value based on the comparisons;

using the remainder and the state to generate at least two other binary digits of the encoded value.

7. The method of claim 6 wherein the remainder and the state are used to generate additional binary digits of the encoded value by applying the remainder and the state to a recursive process, the recursive process comprising multiple iterations, each iteration identified by an iteration number and comprising;

comparing the remainder to a selected set of threshold values, the selected set of threshold values dependent on the iteration number and the state;

determining a new state and new remainder based on the comparison, the new state and new remainder to be used in the next iteration as the state and the remainder respectively; and determining at least two binary digits of the encoded value based on the comparison.

8. The method of claim 7 wherein each set of threshold values are designed to implement a desired coding constraint, the sets of threshold values ensuring the encoded values do not violate the coding constraint.

9. The method of claim 8 wherein a twelve-bit input value is encoded as a fifteen bit encoded value, the first ten bits of the encoded value concatenated from two-bit values and the last five bits of the encoded value from a five-bit value.

10. The method of claim 7 wherein the states and threshold values are based on a trellis, the trellis enforcing constraints on a running digital sum across a codeword of encoded values, the running digital sum increasing by one for each one in the encoded value and decreasing by one for each zero in the encoded value, the trellis such that for a given initial running digital sum, all codewords end at the same running digital sum.

* * * * *

UNITED STATES PATENT AND TRADEMARK OFFICE
CERTIFICATE OF CORRECTION

PATENT NO. : 5,801,649

DATED : SEPTEMBER 1, 1998

INVENTOR(S) : LISA FREDRICKSON

It is certified that error appears in the above-identified patent and that said Letters Patent is hereby corrected as shown below:

On the Title Page under Related U.S. Applicaton Data, [60] delete "Provisional application No. 60/001,986, Aug. 3, 1998.", insert --[60] Provisional application No. 60/001,986, Aug. 3, 1995--

Signed and Sealed this

Nineteenth Day of October, 1999

Attest:

*Attesting Officer*

Q. TODD DICKINSON

*Acting Commissioner of Patents and Trademarks*